US012345376B2

(12) United States Patent
Bordet et al.

(10) Patent No.: US 12,345,376 B2
(45) Date of Patent: Jul. 1, 2025

(54) METHOD AND SYSTEM FOR ASSISTING THE MANAGEMENT OF A LIQUEFIED GAS TRANSPORT SHIP OF THE TYPE CONSUMING EVAPORATED GAS FOR ITS PROPULSION

(71) Applicant: Gaztransport et Technigaz, Saint Remy les Chevreuse (FR)

(72) Inventors: Nicolas Bordet, Saint Remy les Chevreuse (FR); François Hanat, Saint Remy les Chevreuse (FR); Eric Gentilini, Saint Remy les Chevreuse (FR); Mikaël Volut, Saint Remy les Chevreuse (FR)

(73) Assignee: Gaztransport et Technigaz (FR)

( * ) Notice: Subject to any disclaimer, the term of this patent is extended or adjusted under 35 U.S.C. 154(b) by 0 days.

(21) Appl. No.: 18/038,386

(22) PCT Filed: Dec. 3, 2021

(86) PCT No.: PCT/EP2021/084268
§ 371 (c)(1),
(2) Date: May 23, 2023

(87) PCT Pub. No.: WO2022/117872
PCT Pub. Date: Jun. 9, 2022

(65) Prior Publication Data
US 2023/0349515 A1    Nov. 2, 2023

(30) Foreign Application Priority Data

Dec. 3, 2020 (FR) ..................................... 2012627

(51) Int. Cl.
*B63B 79/40* (2020.01)
*B63B 79/20* (2020.01)
(Continued)

(52) U.S. Cl.
CPC ............ *F17C 13/025* (2013.01); *B63B 79/20* (2020.01); *B63B 79/30* (2020.01); *B63B 79/40* (2020.01);
(Continued)

(58) Field of Classification Search
CPC ........ F17C 2250/0694; F17C 2250/043; F17C 2250/032; F17C 2270/0105;
(Continued)

(56) References Cited

U.S. PATENT DOCUMENTS 7,243,009 B2 *  7/2007  Kaji ................... G05B 13/0275
                                                          703/2
2009/0144039 A1 *  6/2009  Thorsteinsson ......... G06F 30/15
                                                          703/6
(Continued)

FOREIGN PATENT DOCUMENTS

CN   107092767 A   8/2017
EP    1956285 A2   8/2008
(Continued)

OTHER PUBLICATIONS

English Language Translation of JP2019018641 (A) (24 pages).
(Continued)

*Primary Examiner* — John F Pettitt, III
(74) *Attorney, Agent, or Firm* — Calderon Safran & Wright PC; Corinne Marie Pouliquen

(57) ABSTRACT

A method for assisting the management of a vessel comprising at least one tank configured to contain liquefied gas and a vapor phase treatment system capable of sending boil-off gas exiting the tank to a propulsion engine of the vessel or to a gas combustion unit on board the vessel and capable of extracting a portion of the liquid phase contained in the tank and of evaporating this portion in order to send it to the propulsion engine. The method comprises: gener- (Continued)

ating at least one tank management scenario defining an evolution of the pressure of the gas phase contained in the tank along a path of the vessel; computing a cost function that at least depends on a total amount of boil-off gas generated in the tank along the path; and displaying to a user the tank management scenario as a function of the computed cost function.

16 Claims, 13 Drawing Sheets

(51) Int. Cl.
    *B63B 79/30*     (2020.01)
    *F17C 13/02*     (2006.01)
    *G01C 21/34*     (2006.01)
    *G06F 30/20*     (2020.01)

(52) U.S. Cl.
    CPC ........ *F17C 13/026* (2013.01); *G01C 21/3469* (2013.01); *G06F 30/20* (2020.01); *F17C 2250/032* (2013.01); *F17C 2250/0404* (2013.01); *F17C 2250/0694* (2013.01); *F17C 2265/066* (2013.01); *F17C 2270/0105* (2013.01)

(58) Field of Classification Search
    CPC ........ F17C 2265/066; F17C 2223/0161; F17C 2221/032; F17C 2250/0439; B63B 79/20; B63B 79/30; B63B 79/40; B63B 49/00; G01C 21/3469
    See application file for complete search history.

(56) References Cited

U.S. PATENT DOCUMENTS

| | | | | |
|---|---|---|---|---|
| 2014/0336853 | A1* | 11/2014 | Bradenham | ............ B63B 49/00 701/21 |
| 2015/0149074 | A1* | 5/2015 | Lepisto | ................ G05D 1/0005 701/410 |
| 2015/0149135 | A1* | 5/2015 | Tervo | ..................... G05B 17/02 703/8 |
| 2015/0149136 | A1* | 5/2015 | Tervo | ..................... B63B 79/10 703/8 |
| 2015/0324714 | A1 | 11/2015 | Shao et al. | |
| 2016/0343092 | A1 | 11/2016 | Legrand et al. | |
| 2019/0241244 | A1 | 8/2019 | Andoh | |
| 2020/0158289 | A1 | 5/2020 | Ando et al. | |
| 2022/0194533 | A1* | 6/2022 | Stojanovic | .............. B63B 79/40 |

FOREIGN PATENT DOCUMENTS

| | | | | |
|---|---|---|---|---|
| EP | 2400271 | A1 * | 12/2011 | ........... G01C 21/203 |
| EP | 3677498 | A1 | 7/2020 | |
| FR | 3013672 | A1 | 5/2015 | |
| JP | S6145837 | A | 3/1986 | |
| JP | 2019010984 | A | 1/2019 | |
| JP | 2019018641 | A | 2/2019 | |
| KR | 20120036412 | A | 4/2012 | |
| KR | 20120045614 | A | 5/2012 | |
| KR | 20160123498 | A | 10/2016 | |
| KR | 101903758 | B1 | 10/2018 | |
| KR | 20180110248 | A | 10/2018 | |
| KR | 20200002522 | A | 1/2020 | |
| WO | WO-2010031399 | A1 * | 3/2010 | ............ B63H 21/14 |
| WO | WO2018008455 | A1 | 1/2018 | |
| WO | WO2018163350 | A1 | 9/2018 | |
| WO | WO2020190279 | A1 | 9/2020 | |

OTHER PUBLICATIONS

English Language Translation of CN107092767 (A) (14 pages).
English Language Translation of JP2019010984 (A) (21 pages).
English Language Translation of JPS6145837A (5 pages).
English Language Translation of KR101903758 (B1) (10 pages).
English Language Translation of KR20120036412 (A) (11 pages).
English Language Translation of KR20120045614 (A) (9 pages).
English Language Translation of KR20160123498 (A) (10 pages).
English Language Translation of KR20180110248 (A) (13 pages).
English Language Translation of KR20200002522 (A) (59 pages).
Englsih Language Translation of WO2018163350 (A1) (25 pages).

* cited by examiner

METHOD AND SYSTEM FOR ASSISTING THE MANAGEMENT OF A LIQUEFIED GAS TRANSPORT SHIP OF THE TYPE CONSUMING EVAPORATED GAS FOR ITS PROPULSION

CROSS-REFERENCE TO RELATED APPLICATIONS AND CLAIM TO PRIORITY

This application is a national stage application of International Application No. PCT/EP2021/084268 filed Dec. 3, 2021, which claims priority to French Patent Application No. 2012627 filed Dec. 3, 2020, the disclosures of which are incorporated herein by reference and to which priority is claimed.

FIELD OF THE INVENTION

The invention relates to the field of vessels for transporting liquefied gas of the type consuming boil-off gas for their propulsion. More specifically, the invention proposes a method and a system for assisting the management of such a vessel.

BACKGROUND OF THE INVENTION

Sealed and thermally insulating tanks are commonly used for transporting liquefied natural gas (LNG) at approximately −162° C. at atmospheric pressure. These tanks can be intended for transporting liquefied gas. Numerous liquefied gases also can be contemplated, in particular methane, ethane, propane, butane, ammonia, dihydrogen or ethylene.

The tanks of vessels can be single or double sealing membrane tanks that allow transportation at atmospheric pressure. The sealing membranes are generally made of a thin sheet of stainless steel or Invar. A membrane is generally in direct contact with the liquefied gas.

Since the liquefied gas is transported at a temperature that is considerably lower than the ambient temperature, said gas naturally tends to slowly heat up when it is transported by a vessel comprising one or more of such tanks, despite the thermal insulation of the tanks. The gas that is generated due to this heating is commonly called boil-off gas (BOG). By way of an example, when transporting LNG at approximately −162° C. at atmospheric pressure, BOG generation of the order of 0.05% to 0.15% of the volume of LNG initially contained in a tank can be observed per day.

In order to take advantage of the BOG, it is known for all or some of it to be used for the propulsion of the vessel, by sending it to a propulsion engine of the vessel that is capable of consuming BOG. In a known manner, the vessel is also typically equipped with a gas combustion unit (GCU) for burning any excess BOG that could not be consumed by the propulsion engine of the vessel.

BOG burned in the GCU along the path taken by the vessel represents a loss since it is not delivered to the vessel and is consumed without any benefit. It is therefore desirable to minimize the amount thereof along a given path of the vessel. Furthermore, even if advantage is taken of the BOG sent to the propulsion engine of the vessel, it also represents a reduction in the amount delivered to the destination of the vessel.

Furthermore, a need exists for solutions for assisting the management of the vessel that allow a total amount of BOG generated in the tank to be limited, so as to limit the amount of BOG to be burned in the GCU and the amount of BOG sent to the propulsion engine of the vessel.

SUMMARY OF THE INVENTION

One idea behind the invention is to use weather forecasts along a forecast path of the vessel and an operating model of the vessel in order to estimate at least a total amount of boil-off gas generated in the tank of the vessel. Another idea behind the invention is to carry out this estimate for at least one, and preferably several, tank management scenarios defining an evolution of the pressure of the gas phase contained in the tank along said forecast path. Yet another idea behind the invention is to display to a user at least one of said tank management scenarios as a function of a cost function that at least depends on a total amount of boil-off gas generated in the tank along said forecast path.

According to one embodiment, the invention provides a computer-implemented method for assisting the management of a vessel for transporting liquefied gas, the vessel comprising at least one tank configured to contain liquefied gas and a vapor phase treatment system, the vapor phase treatment system being capable of sending boil-off gas exiting the tank to a propulsion engine of the vessel or to a gas combustion unit on board the vessel, the vapor phase treatment system further being capable of extracting a portion of the liquid phase contained in the tank and of evaporating this portion in order to send it to the propulsion engine, the method comprising:

providing an initial state of the tank, said initial state of the tank comprising an initial pressure of the gas phase contained in the tank and an initial temperature of the liquid phase contained in the tank;

providing a forecast path of the vessel;

determining, on the basis of weather forecasts, at least one environmental parameter of the vessel along said forecast path;

determining a speed curve of the vessel along said forecast path;

generating a tank management scenario defining an evolution of the pressure of the gas phase contained in the tank during said forecast path, and, on the basis of the tank management scenario thus generated:

a) estimating a curve of the power required to be output from the propulsion engine along said forecast path as a function of said speed curve of the vessel and of said at least one environmental parameter;

b) estimating a curve of the amount of boil-off gas generated in the tank along said forecast path;

c) estimating, on the basis of said required power curve and of said curve of the amount of boil-off gas generated, a curve of the amount of gas to be extracted from the tank and a curve of the amount of boil-off gas to be burned in the gas combustion unit; and d) computing a cost function that at least depends on a total amount of boil-off gas generated in the tank along said forecast path; and displaying to a user the tank management scenario as a function of the computed cost function.

By virtue of these features, a tank management scenario can be assessed by computing the cost function and can be displayed to the user with a view to offering decision-making assistance.

According to embodiments, such a method can comprise one or more of the following features.

According to one embodiment, multiple tank management scenarios are generated, with steps a) to d) being carried out for each tank management scenario, and at least one of said tank management scenarios is displayed to the user as a function of the computed cost function for said tank management scenario.

Thus, a significant number of tank management scenarios can be assessed by computing the cost function, and one or more tank management scenarios that best minimize the cost function can be displayed to the user with a view to offering decision-making assistance.

According to one embodiment, before displaying at least one of said tank management scenarios to the user, said tank management scenarios are iteratively regenerated a number of times by a first evolutionary algorithm using the cost function as a first objective function.

The term "evolutionary algorithm" is understood to mean a method that is typically implemented by a computer, in which a group of solutions is generated, then each solution is assessed by an objective function, some of the solutions are selected that best minimize the objective function, a new group of solutions is generated from the solutions thus selected and these steps are repeated as long as a stop criterion is not verified. Within the scope of the present invention, each tank management scenario is a solution, and the cost function acts as an objective function for the evolutionary algorithm.

Various types of evolutionary algorithms are known as such. In one embodiment, the evolutionary algorithm is a genetic algorithm. Evolutionary algorithms are particularly well suited for optimization issues.

As mentioned above, an evolutionary algorithm necessarily uses a stop criterion in order to decide when to stop searching for more optimal solutions. According to one embodiment, the stop criterion is a computation time criterion, which ensures that the method displays to the user one or more optimized tank management scenarios at the end of a given computation time.

According to one embodiment, the forecast path of the vessel is divided into consecutive time intervals, and the one or each tank scenario defines an average value of the pressure of the gas phase contained in the tank during each of said consecutive time intervals.

According to one embodiment, said at least one tank management scenario displayed to the user is displayed together with a minimum value of the pressure of the gas phase contained in the tank and/or a maximum value of the pressure of the gas phase contained in the tank during each of said consecutive time intervals.

According to one embodiment, said forecast path comprises path steps each defined by two waypoints and a heading to be followed between said two waypoints, and, in step a), the curve of the power required to be output from the propulsion engine along said forecast path is estimated as a function of said headings to be followed, of said speed curve of the vessel and of said at least one environmental parameter.

In this way, the assessment of the tank management scenarios also takes into account the impact of the heading of the vessel on the power required to be output from the propulsion engine. Indeed, by way of an example, depending on the angle between the heading of the vessel and the direction of the current, wind and waves, this power can be higher or lower.

According to one embodiment, said speed curve of the vessel is determined on the basis of said forecast path and of said at least one environmental parameter by a second evolutionary algorithm using a second objective function that depends on said total amount of boil-off gas generated in the tank along said forecast path and on a difference between a required time of arrival at the destination and an estimated time of arrival at the destination.

In this way, estimating the power required to be output from the propulsion engine takes into account a required time of arrival of the vessel, with said time being able to be specified as an input parameter by a user.

A terminal for offloading liquefied gas systematically requires that the tank has a given offloading pressure and/or offloading temperature. According to one embodiment, providing a forecast path of the vessel comprises providing an offloading pressure and/or an offloading temperature required by an offloading terminal at the destination of the vessel, and, in step d), the cost function further depends on a difference between the pressure of the gas phase contained in the tank at the end of said forecast path and said offloading pressure and/or a difference between the temperature of the liquid phase contained in the tank at the end of said forecast path and said offloading temperature.

In this way, a tank management scenario is considered to be even more acceptable when it allows the offloading terminal located at the destination point to be reached with an offloading pressure and/or an offloading temperature close to those required by the offloading terminal.

According to one embodiment, in step a), the required power curve is estimated using a first statistical model, the first statistical model being capable of estimating a power required to be output from the propulsion engine at least as a function of a vessel speed setpoint and of said at least one environmental parameter, and the first statistical model being trained by a supervised machine learning method.

The term "supervised machine learning method" or "supervised learning" is understood to mean a machine learning method involving learning a forecasting function on the basis of annotated examples. In other words, a supervised machine learning method allows a model to be constructed that is capable of forecasting from a plurality of examples for which the response to be forecast is known. A supervised machine learning method is typically implemented by a computer; the training of the first statistical model is thus typically implemented by a computer.

Of course, it is understood that in the sentence or feature stating "train a statistical model using a supervised machine learning method on a set of test data", the "set of test data" can also comprise or be made up of data derived from "real" campaigns, i.e., obtained or recorded on vessels circulating as a transporter and a user of liquefied gas.

According to one embodiment, the aforementioned step b) involving estimating a curve of the amount of boil-off gas generated in the vessel along said forecast path comprises estimating a first amount of boil-off gas generated in the vessel as a function of a current pressure of the gas phase contained in the vessel and of a current temperature of the liquid phase contained in the vessel and estimating a second amount of boil-off gas generated in the tank as a function of a current pressure of the gas phase contained in the tank and of said at least one environmental parameter.

Thus, estimating the amount of boil-off gas generated in the tank takes into account both the generation of boil-off gas related to the coexistence of the liquid phase and of the gas phase in the tank, and the generation of boil-off gas due to the agitation of the liquid phase due to the movements experienced by the vessel.

According to one embodiment, the second amount of boil-off gas generated in the tank is estimated using a second statistical model, the second statistical model being trained by a supervised machine learning method.

According to one embodiment, the initial state comprises an initial composition of the liquefied gas contained in the tank, and step b) involving estimating a curve of the amount of boil-off gas generated in the tank along said forecast path further comprises estimating a composition of the boil-off gas generated in the tank.

A cargo of liquefied gas is almost never chemically pure: it is generally a mixture of several liquefied gases, with one being predominantly by weight and the other(s) being present in the form of impurities. However, the initial composition of the cargo is generally indicated by the supplier of the liquefied gas when it is loaded into the tank. By indicating the initial composition of the liquefied gas and by estimating a composition of the boil-off gas generated in the tank, the fact that the composition of the boil-off gas will evolve along the forecast path is taken into account, due to the various evaporation properties of the gases forming the cargo of liquefied gas.

According to one embodiment, the environmental parameter comprises at least one from among a current direction, a current speed, a wind speed, a wind direction, an average wave height, a wave direction, and a wave period.

According to one embodiment, the vapor phase treatment system further comprises a reliquefaction plant capable of reliquefying boil-off gas exiting the tank and of returning the boil-off gas thus re-liquefied to the tank, and the aforementioned step c) comprises estimating, on the basis of said required power curve and of said curve of the amount of boil-off gas generated, a curve of the amount of gas to be extracted from the tank, a curve of the amount of boil-off gas to be burned in the gas combustion unit, and a curve of the amount of boil-off gas to be sent to the reliquefaction plant.

According to one embodiment, the vapor phase treatment system further comprises a sub-cooler capable of sub-cooling a portion of the liquid phase contained in the vessel and of returning the portion thus sub-cooled to the tank, and wherein the aforementioned step c) comprises estimating, on the basis of said required power curve and of said curve of the amount of boil-off gas generated, a curve of the amount of gas to be extracted from the tank, a curve of the amount of boil-off gas to be burned in the gas combustion unit, and a curve of the amount of liquid phase to be extracted from the tank and to be sent to the sub-cooler.

According to one embodiment, the steps of the method are repeated at fixed intervals and/or upon receipt of new weather forecasts.

Thus, the method regularly re-assesses tank management scenarios as the vessel progresses along its forecast path and as new weather forecasts are available. Additionally or alternatively, the steps of the method can be repeated on command by a user.

According to one embodiment, the invention further provides a system for assisting the management of a vessel for transporting liquefied gas, the vessel comprising at least one tank configured to contain liquefied gas and a vapor phase treatment system, the vapor phase treatment system being capable of sending boil-off gas exiting the vessel to a propulsion engine of the vessel or to a gas combustion unit on board the vessel, the vapor phase treatment system further being capable of extracting a portion of the liquid phase contained in the tank and of evaporating this portion in order to send it to the propulsion engine, the management assistance system comprising:

an acquisition unit configured to acquire an initial state of the tank and a forecast path of the vessel, said initial state of the tank comprising an initial pressure of the gas phase contained in the tank and an initial temperature of the liquid phase contained in the tank;

a first communication unit configured to obtain weather forecasts from a weather forecast provider; and a computation unit configured to: determine a speed curve of the vessel along said forecast path; generate a tank management scenario defining an evolution in the pressure of the gas phase contained in the tank along said forecast path, and, on the basis of the tank management scenario thus generated, configured to:

a) estimate a curve of the power required to be output from the propulsion engine along said forecast path as a function of said speed curve of the vessel and of said at least one environmental parameter;

b) estimate a curve of the amount of boil-off gas generated in the tank along said forecast path;

c) estimate, on the basis of said required power curve and of said curve of the amount of boil-off gas generated, a curve of the amount of gas to be extracted from the tank and a curve of the amount of boil-off gas to be burned in the gas combustion unit;

d) compute a cost function that at least depends on a total amount of boil-off gas generated in the tank along said forecast path; and comprising a display unit configured to display to a user the tank management scenario as a function of the computed cost function.

Such a system provides the same advantages as the method described above.

According to one embodiment, said forecast path comprises path steps each defined by two waypoints and a heading to be followed between said two waypoints, and wherein the computation unit is configured to: a) estimate a curve of the power required to be output from the propulsion engine along said forecast path as a function of said headings to be followed, of said speed curve of the vessel and of said at least one environmental parameter.

According to one embodiment, the acquisition unit and the display unit are on board the vessel, the first communication unit and the computation unit are located in a ground station, and wherein the system further comprises a second communication unit configured to connect the acquisition unit and the computation unit.

BRIEF DESCRIPTION OF THE DRAWINGS

The invention will be better understood, and further aims, details, features and advantages thereof will become more clearly apparent, throughout the following description of several particular embodiments of the invention, which are provided solely by way of a non-limiting illustration, with reference to the accompanying drawings.

DETAILED DESCRIPTION OF THE PREFERRED EMBODIMENTS

The embodiments hereafter are described in relation to a vessel comprising a double hull forming a supporting structure, in which a plurality of sealed and thermally insulating tanks are arranged. In such a supporting structure, the tanks have, for example, a polyhedral geometry, for example, of prismatic shape.

Such sealed and thermally insulating tanks are provided, for example, for transporting liquefied gas. The liquefied gas is stored and transported in such tanks at a low temperature, which requires thermally insulating tank walls in order to maintain the liquefied gas at this temperature.

Such sealed and thermally insulating tanks also comprise an insulating barrier anchored to the double hull of the vessel and supporting at least one sealed membrane. By way of an example, such tanks can be produced in accordance with the technologies marketed under the brands Mark III® or NO96® of the applicant, or the like.

Figure 1:
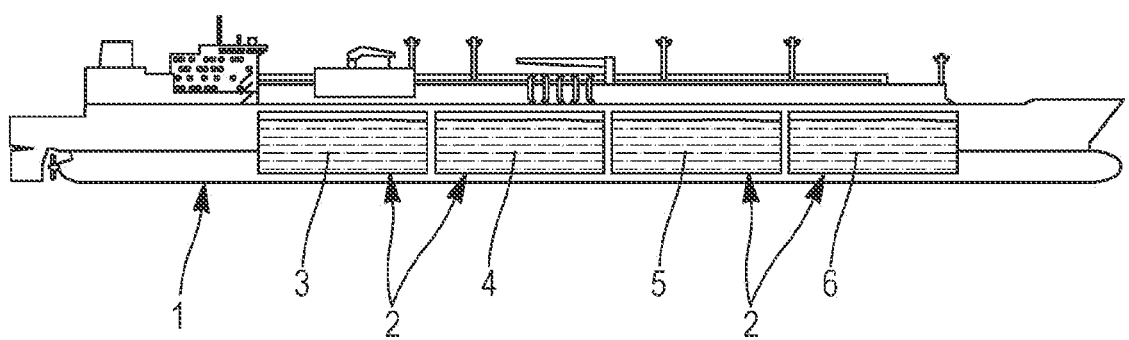
FIG. 1 is a schematic representation of a vessel for transporting liquefied gas.

FIG. 1 illustrates a vessel 1 comprising four sealed and thermally insulating tanks 2. The four tanks 2 can have identical or different filling states.

Figure 2:
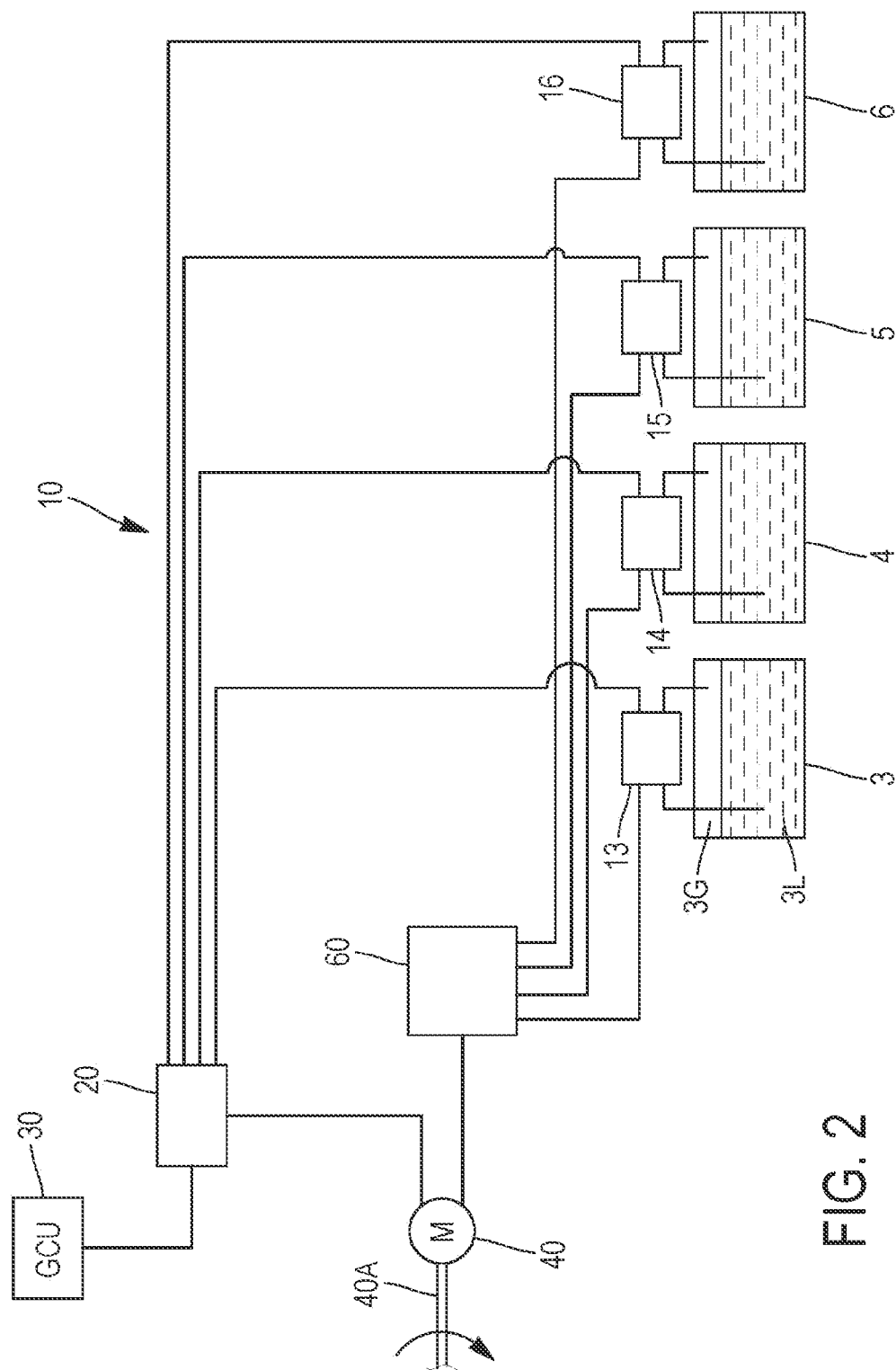
FIG. 2 is a block diagram schematically showing the tanks of the vessel of FIG. 1, as well as a vapor phase treatment system, a propulsion engine of the vessel and a gas combustion unit on board the vessel.

FIG. 2 is a block diagram schematically showing the four tanks 3, 4, 5, 6 of the vessel of FIG. 1. As shown in FIG. 2, the vessel 1 is further provided with a vapor phase treatment system 10, an engine 40 and a gas combustion unit (GCU) 30.

The engine 40 provides the power required for the propulsion of the vessel 1; it can, as an alternative embodiment, provide both said power required for the propulsion of the vessel 1 and the power required for electrically powering other equipment of the vessel 1 (commonly referred to as "Hotel Load"). In a manner per se known, the engine 40 is capable of consuming gas in the vapor phase, which can originate from the boil-off gas (BOG) exiting the tanks 3, 4, 5, 6 or can originate from a heater 60 intended to vaporize the liquefied gas extracted from the tanks. Such an engine 40 is known as such and therefore it is not described in detail herein.

Still in a manner per se known, the GCU 30 is capable of burning any excess BOG that could not be consumed by the engine 40. Such a GCU 30 is known as such and therefore it is not described in detail herein.

The vapor phase treatment system 10 is capable of sending BOG exiting each tank 3, 4, 5, 6 to the engine 40 or to the GCU 30, as applicable. To this end, the vapor phase treatment system 10 respectively comprises a vapor phase treatment sub-system 13, 14, 15, 16 for each of the tanks 3, 4, 5, 6, and a BOG distribution unit 20 communicating with these sub-systems 13, 14, 15, 16 so as to allow the BOG to be sent to the engine 40 or the GCU 30, as applicable. Such vapor phase treatment systems and sub-systems are known as such and are therefore not described in detail herein.

Still in a manner per se known, each sub-system 13, 14, 15, 16 is also capable of extracting a portion of the liquid phase contained in the corresponding tank 3, 4, 5, 6 and of sending this portion to the heater 60 in order to evaporate it when this is desired.

Although a vessel 1 provided with four tanks has been shown, it is clearly understood that the vessel 1 can be provided with a different number of tanks, in particular a single tank or even any number of tanks.

Hereafter and for the sake of convenience, the management assistance method 300 will be described with reference to the tank 3, with it being understood that the management assistance method 300 can be implemented simultaneously for several or for each of the tanks 3, 4, 5, 6.

Figure 3:
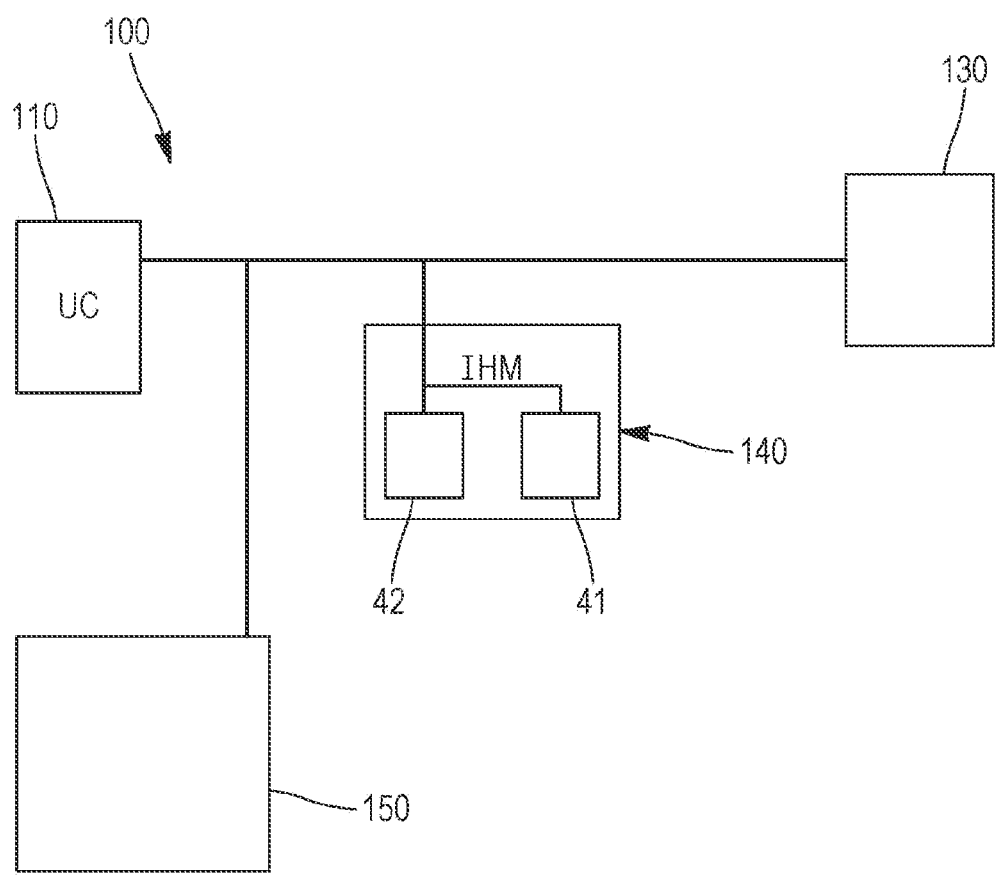
FIG. 3 is a block diagram of a system for assisting the management of the vessel of FIG. 1.

FIG. 3 illustrates an example of a management assistance system 100 on board the vessel 1. This management assistance system 100 comprises a central unit 110 connected to a communication interface 130, a human-machine interface 140 and a database 150.

The communication interface 130 allows the central unit 110 to communicate with remote devices, for example, in order to obtain weather data, position data of the vessel or the like.

The human-machine interface 140 comprises a display means 41. The display means 41 allows one or more tank management scenarios 50 to be displayed to a user, as will be described hereafter.

The human-machine interface 140 further comprises an acquisition means 42 allowing the user to manually provide the central unit 110 with quantities, as will be described hereafter.

The management assistance system 100 further comprises a database 150. This database 150 can be used for storing models, in particular models 61, 62, 63 as will be described hereafter.

Figure 4:
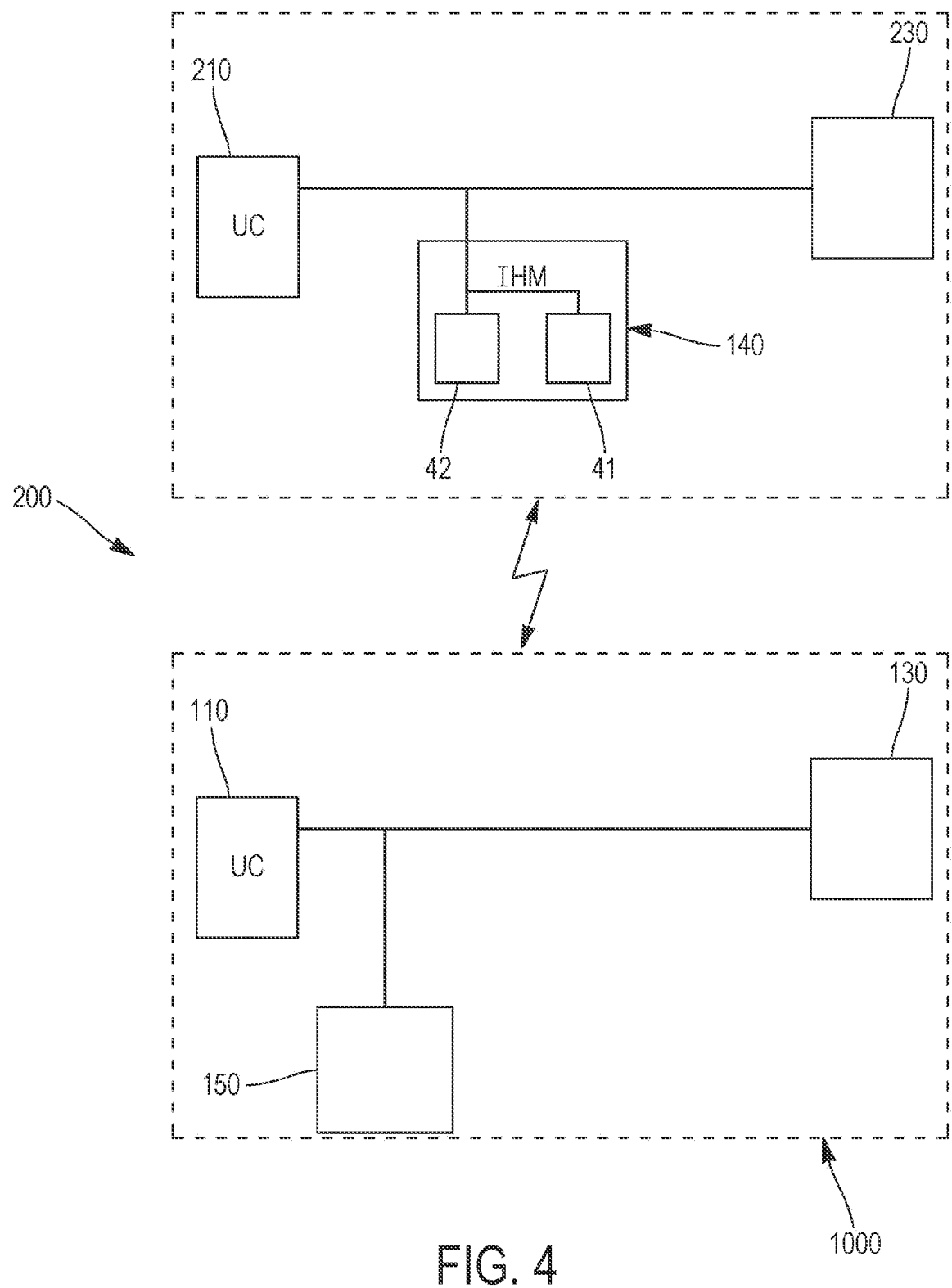
FIG. 4 is a block diagram of a system for assisting the management of the vessel of FIG. 1 according to an alternative embodiment of FIG. 3.

FIG. 4 illustrates an example of a management assistance system 200 located on land and communicating with the vessel 1. The vessel 1 comprises a central unit 210, the human-machine interface 140 and a communication interface 230. The central unit 1, the communication interface 130 and the database 150 for their part are located in a ground station 1000. The operation of the management assistance system 200 is similar to the operation of the management assistance system 100 and differs only in terms of sending the results of the computations carried out by the land-based central unit 1 to the human-machine interface 140 on board the vessel 1 by means of the communication interfaces 130 and 230. By way of an example, the communication interfaces 130 and 230 can use a terrestrial or satellite radio frequency data transmission.

With reference to FIGS. 5A to 9, a method 300 for assisting the management of the vessel 1 will now be described, which method can be implemented using the management assistance system 100 or 200.

The method 300 comprises a first step 301 involving providing an initial state of the tank 3. This initial state comprises an initial pressure of the gas phase 3G contained in the tank 3 and an initial temperature of the liquid phase 3L contained in the tank 3. This information is entered, for example, by a user by means of the acquisition means 42.

Preferably, the initial state further comprises an initial composition of the liquefied gas contained in the tank 3. This initial composition is generally indicated by the liquefied gas supplier when it is loaded into the tank 3. It can be entered, for example, by the user using the acquisition means 42.

Figure 6:
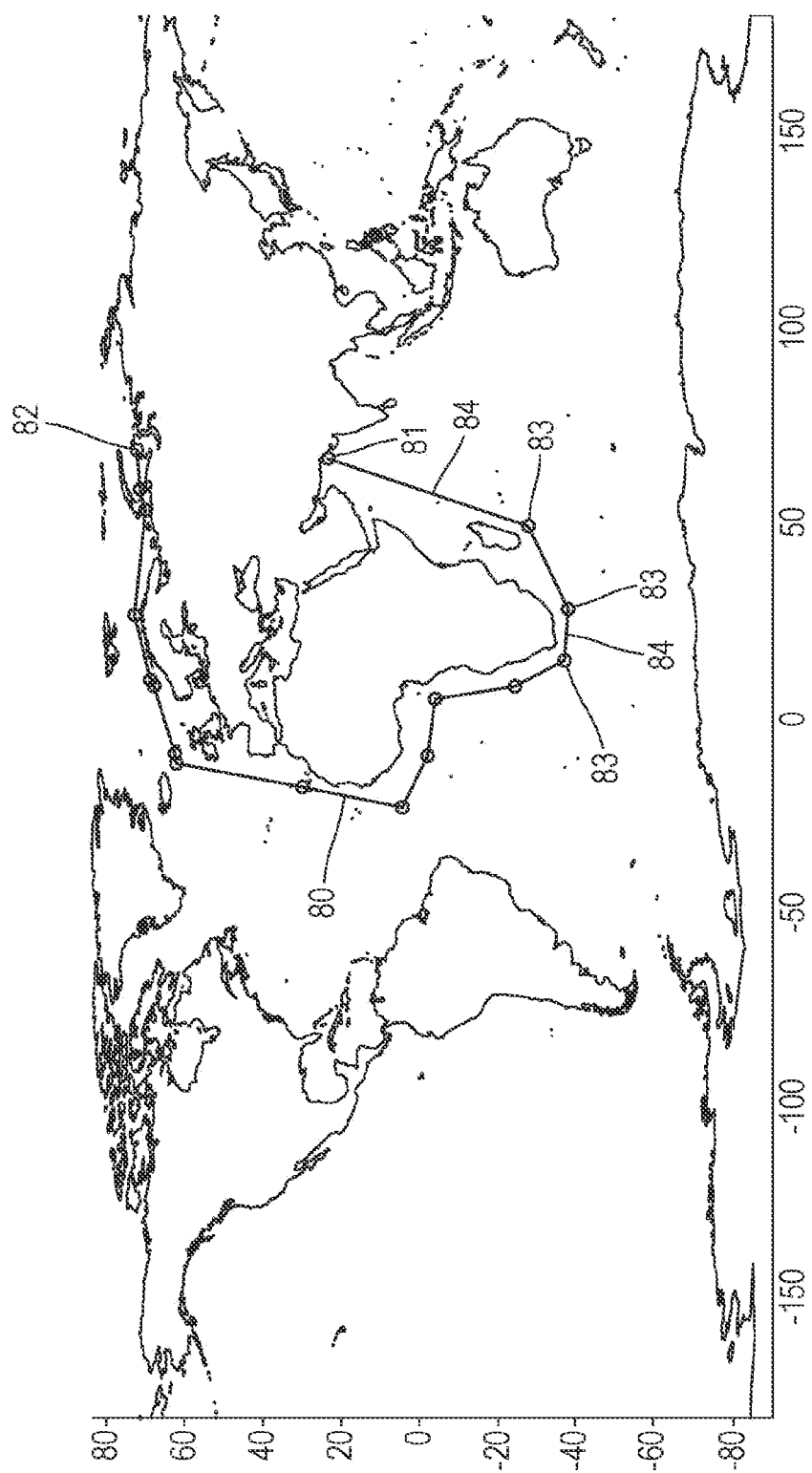
FIG. 6 shows, by way of an illustration, an example of a forecast path of the vessel.

The method 300 further comprises a step 302 involving providing a forecast path 80 of the vessel 1. FIG. 6 shows, by way of an illustration, an example of a forecast path 80. As shown in this figure, the forecast path 80 is defined by a starting point 81, a destination point 82, and a plurality of waypoints 83 through which the vessel 1 is intended to pass. The points 81, 82, 83 are entered, for example, by the user using the acquisition means 42. The points 81, 82, 83 are defined by their geographical coordinates in a manner per se known.

Each pair of consecutive waypoints 83 together define a path step 84. The forecast path 80 also can be defined by a heading to be followed by the vessel 1 along the path steps 84.

The method 300 further comprises a step 303 involving determining at least one environmental parameter of the vessel 1 along the forecast path 80 on the basis of weather forecasts. Specifically, using the communication interface 130, the central unit 110 acquires weather forecasts provided by a weather forecasts provider and determines the at least one environmental parameter on the basis of the weather forecasts and the forecast path 80. The environmental parameter comprises at least one from among a direction of the current, a speed of the current, a wind speed, a wind direction, an average wave height, a wave direction, and a wave period, and preferably several or even all these parameters. It should be noted that some of the environmental parameters can be directly provided by the weather forecast provider, while others can be estimated by the central unit 10 by applying a model to the weather forecasts.

The method 300 further comprises a step 304 involving determining a speed curve of the vessel 1 along the forecast path 80. In a simplified embodiment, the speed curve simply can be provided as input data, for example, by the user using the acquisition means 41.

The method 300 further comprises a step 305 involving generating a plurality of tank management scenarios 50.

Figure 7:
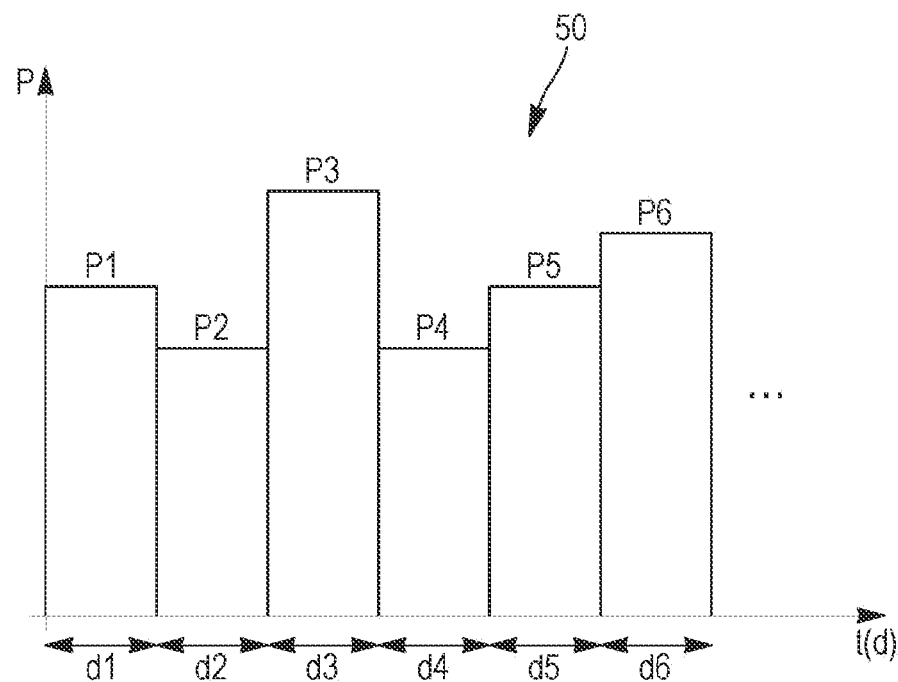
FIG. 7 is a graph showing, by way of an illustration, an example of a tank management scenario generated in the system for assisting management of FIG. 3.

FIG. 7 is a graph showing, by way of an illustration, an example of a tank management scenario 50. As shown in this figure, a given tank management scenario 50 defines an evolution of the pressure P of the gas phase 3G contained in the tank 3 as a function of time t, during said forecast path. In a preferred embodiment, with the forecast path 80 being divided into consecutive time intervals d1, d2, d3, d4, d5, d6, etc., the tank management scenario 50 defines average values P1, P2, P3, P4, P5, P6, etc., of the pressure P over the time intervals d1, d2, d3, d4, d5, d6, etc. The time intervals d1, d2, d3, d4, d5, d6, etc. each particularly can be equal to one day.

The tank management scenarios 50 can be randomly generated, for example, in step 305.

Figure 5A:
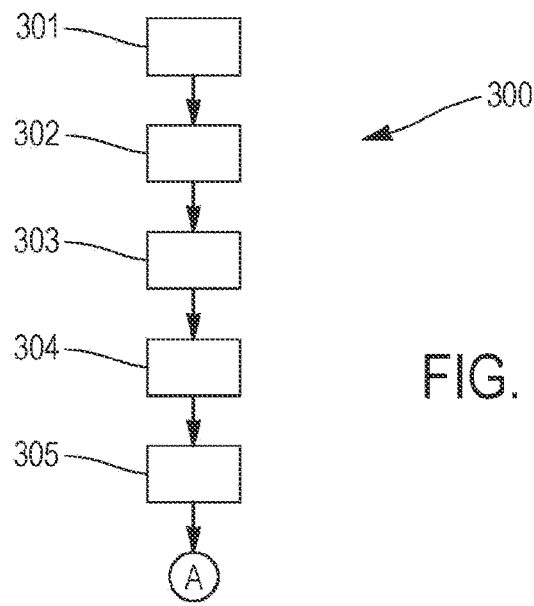
FIG. 5A is a block diagram illustrating the first steps of a method for assisting the management of the vessel of FIG. 1, the method being able to be implemented by the system for assisting management of FIG. 3.
Figure 5B:
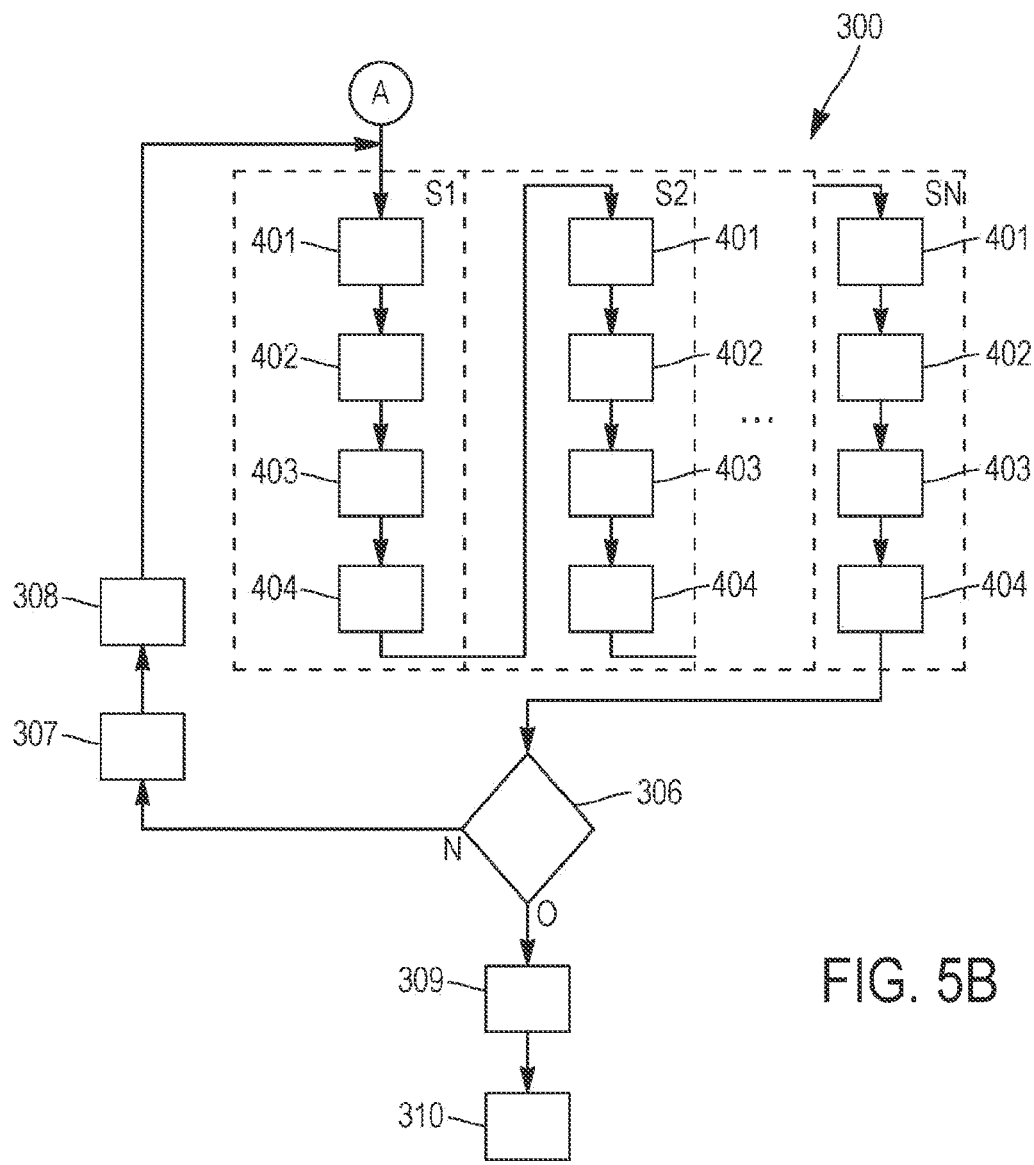
FIG. 5B is a block diagram illustrating the next steps of the method of FIG. 5A.

After step 305, the method 300 proceeds to assessing the tank management scenarios 50 (reference A in FIGS. 5A and 5B).

According to a preferred embodiment that will be described in further detail hereafter, the method 300 implements an evolutionary algorithm using, as an objective function, a cost function that at least depends on a total amount of BOG generated in the tank 3 along the forecast path 80. Within the context of this evolutionary algorithm, in a manner per se known, the tank management scenarios 50 are iteratively regenerated multiple times, with each new generation of tank management scenarios 50 being generated on the basis of a certain number of tank management scenarios 50 of the preceding generation that best minimize the cost function.

Figure 8:
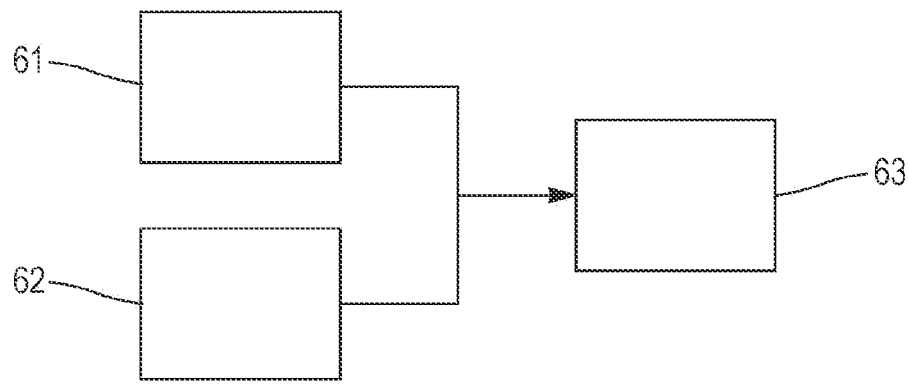
FIG. 8 is a block diagram showing, by way of an explanation, the models used by the system for assisting management of FIG. 3 in order to assess a given tank management scenario.

FIG. 8 is a block diagram that illustrates, in order to facilitate the understanding of the following description, models 61, 62, 63 that are implemented in order to assess the cost function. These models 61, 62, 63 can be stored in the database 150 of the management assistance system 100.

A first model 61, which will be called "engine model 61" hereafter, is capable of estimating a power required to be output from the engine 40, more specifically a mechanical power required on an output shaft 40A of the engine 40 (see FIG. 2). This mechanical power can be the only power required for the propulsion of the vessel 1. As an alternative, it can be the sum of the power required for the propulsion of the vessel 1 and of the power required for electrically powering other equipment of the vessel 1 (commonly referred to as "Hotel Load"). In any case, the engine model 61 is capable of estimating the power required to be output from the engine 40 as a function of a speed setpoint of the vessel 1, of the at least one environmental parameter, and optionally of the heading of the vessel 1.

According to a particular embodiment, the engine model 61 is a statistical model trained by a supervised machine learning method. This statistical model is trained on the basis of a set of test data, with the set of test data being able to be obtained from navigation tests involving navigating a vessel and measuring:
- on the one hand, a speed of the vessel and at least one environmental parameter selected from among the wave height, the wave period, the angle between the wave direction and the heading of the vessel, the wind speed, the angle between the wind direction and the heading of the vessel;
- on the other hand, a power output from the engine of the vessel that is required to maintain the speed of the vessel.

A second model 62, which will be called "tank model 62" hereafter, is capable of estimating an amount of BOG generated in the tank 3. The tank model 62 estimates the amount of BOG generated in the tank by separately estimating:
- a first amount of BOG generated in the tank 3 as a function of the current pressure P of the gas phase 3G contained in the tank 3 and of the current temperature T of the liquid phase 3L contained in the tank 3; and
- a second amount of BOG generated in the tank 3 as a function of the current pressure P of the gas phase 3G and of the at least one environmental parameter, then by adding these two amounts of BOG.

The first amount of BOG reflects the generation of BOG linked to the coexistence of the liquid phase 3L and of the gas phase 3G. It can be estimated using a thermodynamic model per se known, for example, a Hertz-Knudsen model.

The second amount of BOG reflects the additional generation of BOG in the tank 3 due to the agitation of the liquid phase 3L due to the movements experienced by the vessel 1.

According to a particular embodiment, the second amount of BOG is estimated by a statistical model trained by a supervised machine learning method. This statistical model is trained on the basis of a set of test data, with the set of test data being able to be obtained from navigation tests involving navigating a vessel and measuring:
- on the one hand, a pressure of the gas phase contained in the tank and a temperature of the liquid phase contained in the tank; and
- on the other hand, a difference between the amount of BOG actually generated in the tank of the vessel and an estimated amount of BOG estimated by a thermodynamic model.

Furthermore, if, as mentioned above, an initial composition of the liquefied gas contained in the tank 3 is supplied in step 301, the tank model 62 can also estimate the composition of the BOG generated in the tank 3. In this case, the model estimating the first amount of BOG and the model estimating the second amount of BOG each estimate the composition of the BOG generated in the tank 3.

A third model 63, which will be called "flow model 63" hereafter, is capable of estimating an amount of gas to be extracted from the tank 3 by the vapor phase treatment sub-system 13 and an amount of BOG to be burned in the GCU 30. More specifically, the flow model 63 estimates, on the basis of the power estimated by the model 61, an amount of BOG to be supplied to the engine 40, and compares this amount of BOG to be supplied to the engine 40 with the amount of BOG generated in the tank 3 estimated by the tank model 62. If the amount of BOG to be supplied to the engine 40 is less than the amount of BOG generated in the tank 3, the flow model 63 determines that the difference between these two amounts is to be burned in the GCU 30. Conversely, if the amount of BOG to be supplied to the engine 40 is greater than the amount of BOG generated in the tank 3, the flow model 63 determines that the difference between these two amounts is to be extracted from the tank 3 by the vapor phase treatment sub-system 13.

The models 61, 62, 63 are implemented iteratively, with a very small time gap relative to the duration of the intervals d1, d2, etc., so as to estimate, for each iteration, the pressure P of the gas phase 3G, the temperature T of the liquid phase 3L, the amount of BOG generated by the tank 3 (and where appropriate the composition of the BOG generated by the tank 3), and the amount of BOG to be supplied to the engine 40 and to the GCU 30.

With further reference to FIG. 5B, the steps for successfully assessing the cost function will now be described. With N being the number of tank management scenarios 50 generated in step 305, the method 300 carries out N assessments S1, S2, ..., SN for each of the tank management scenarios 50. Although the diagram of FIG. 5B represents the assessments S1, S2, ..., SN as being carried out sequentially, these optionally can be carried out at the same time. Each assessment S1, S2, ..., SN comprises steps 401, 402, 403, 404 that are described hereafter.

In step 401, on the basis of the speed curve of the vessel 1 determined in step 304 and of the at least one environmental parameter determined in step 303, a curve of the power required to be output from the engine 40 along the forecast path 80 is estimated using the engine model 61.

In step 402, a curve of the amount of BOG generated in the tank 3 along the forecast path 80 is estimated using the tank model 62.

In step 403, on the basis of the curve of the power required to be output from the engine 40 estimated in step 401 and on the curve of the amount of BOG generated in the tank 3 estimated in step 402, a curve of the amount of gas to be extracted from the tank 3 and a curve of the amount of BOG to be burned in the GCU 30 are estimated using the flow model 63.

After steps 401 to 403, in a step 404, a cost function is computed. More specifically, the cost function is a real number that is computed on the basis of the estimates carried out in steps 401 to 403, and that quantifies the acceptability of the relevant tank management scenario 50.

In a simple embodiment, the cost function only depends on the total amount of BOG generated in the tank 3 along the forecast path 80. However, it is preferable for the cost function to also depend on other quantities or criteria.

In a preferred embodiment, the cost function further depends on:
- a difference between the pressure P of the gas phase contained in the tank 3 at the end of the forecast path 80 and on the offloading pressure required by an offloading terminal located at the destination point 82; and/or
- a difference between the temperature T of the liquid phase contained in the tank 3 at the end of said forecast path 80 and an offloading temperature required by an offloading terminal located at the destination point 82; and preferably both of these two differences. In this way, a tank management scenario 50 is considered to be all the more acceptable when it allows the vessel to reach the offloading terminal located at the destination point 82 with an offloading pressure and an offloading temperature close to those required by the offloading terminal.

Additionally or alternatively, the cost function can also depend on compliance, by the tank management scenario 50, with some or all of the following criteria:
- the pressure P of the gas phase contained in the tank 3 remains below a maximum safety pressure; this maximum safety pressure can be a set value defined in advance, or even a variable value that depends on environmental conditions encountered by the vessel 1 along the forecast path 80, and that can be lower, for example, in the event of stormy or other potentially dangerous navigation conditions;
- the pressure P of the gas phase contained in the tank 3 remains higher than a minimum pressure; this minimum pressure can be a set value defined in advance, or even a variable value that depends on the amount of BOG demanded by the engine 40, as estimated by the flow model 63;
- the flow rate of BOG through the vapor phase treatment system 10 remains below a threshold value.

As previously mentioned, each of the steps 401 to 404 is carried out within the context of each of the assessments S1, S2, ..., SN of the tank management scenarios 50.

After the assessments S1, S2, ..., SN, the method 300 proceeds to a step 306 involving verifying whether a stop criterion is verified. In one embodiment, the stop criterion is a computation time criterion. In other words, the stop criterion is considered to be verified if a computation time defined in advance is reached or exceeded. Alternatively, the stop criterion can be a criterion with a number of iterations.

In any case, if the stop criterion is not verified (reference "N" in step 306 in FIG. 5B), the method 300 proceeds to a step 307 involving selecting k tank management scenarios 50 from among the N tank management scenarios 50 assessed during the assessments S1, S2, ..., SN, where k<N. The k tank management scenarios 50 selected in step 307 are those that best minimize the cost function computed in step 404. In an alternative embodiment, k is a number that is set in advance. In another alternative embodiment, k is not set in advance, and the k selected tank management scenarios 50 are those for which the cost function computed in step 404 is below a threshold.

After step 307, the method 300 proceeds to a step 308 involving generating N new tank management scenarios 50 on the basis of the k tank management scenarios 50 selected in step 307.

As mentioned above, in this embodiment, the method 300 implements an evolutionary algorithm using, as an objective function, the cost function computed in step 404. In a particular embodiment, the evolutionary algorithm is a genetic algorithm. The optimization methods using an evolutionary algorithm are well known as such. Step 305 then involves initializing the group considered by the evolutionary algorithm by randomly generating N tank management scenarios 50, and step 308 involves generating N new tank management scenarios 50 by crossing and mutating the tank management scenarios selected in step 307.

If, on the contrary, the stop criterion is verified (reference "O" in step 306 in FIG. 5B), the method 300 proceeds to a step 309 involving selecting p tank management scenarios 50 from among the N tank management scenarios 50 assessed during the assessments S1, S2, ... SN, where 1≤p<N. The tank management scenarios 50 selected in step 307 are those that best minimize the cost function computed in step 404. In an alternative embodiment, p is a number that is set in advance. In another alternative embodiment, p is not set in advance, and the p selected tank management scenarios are those for which the cost function computed in step 404 is below a threshold.

After step 309, the method 300 proceeds to a step 310 involving displaying to the user the tank management scenarios selected in step 309, for example, on the display means 41.

In a highly simplified alternative embodiment, a single tank management scenario 50 is generated in step 305. Steps 401 to 404 are then carried out for this single tank management scenario 50, and steps 306, 307, 308 are omitted. Step 309 involves determining, as a function of the cost function computed in step 404, whether the tank management scenario 50 is acceptable. If so, this tank management scenario 50 is displayed in step 310.

In another simplified alternative embodiment, multiple tank management scenarios 50 are generated in step 308, but the steps 306, 307, 308 are omitted.

The steps of the method 300 can be repeated at set intervals and/or upon receipt of new weather forecasts by the communication interface 130. In addition or as an alternative, the steps of the method 300 can be repeated on command by the user.

In any case, the method 300 results in, in step 310, the user being displayed, for example, on the display means 41, at least one tank management scenario 50, as a function of the cost function computed in step 404. The method 300 thus allows the user to be offered assistance for decision-making.

As mentioned above, a given tank management scenario 50 can define average values P1, P2, P3, P4, P5, P6, etc. of the pressure P over consecutive time intervals d1, d2, d3, d4, d5, d6, etc. In a preferred embodiment, after step 309 and before step 310, the one or more tank management scenarios 50 selected in the step can be post-processed so as to also display to the user minimum and maximum values of the pressure P over the consecutive time intervals d1, d2, d3, d4, d5, d6, etc.

Figure 9:
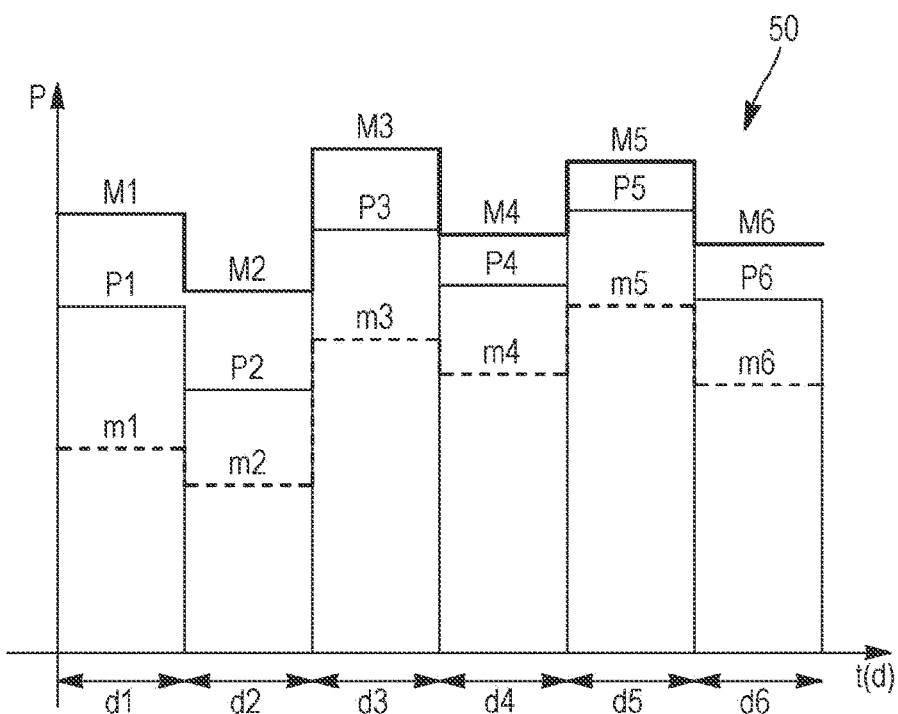
FIG. 9 is a graph showing, by way of an illustration, an example of a tank management scenario similar to that of FIG. 7, to which minimum and maximum values of the pressure in the tank are associated.

FIG. 9 is a graph showing, by way of an illustration, an example of a tank management scenario 50 thus post-processed. As shown in this figure, the tank management scenario 50 defines, over the interval d1, in addition to the average value P1, a maximum value M1 and a minimum value m1, with the pressure P not being able to be greater than the maximum value M1 or less than the minimum value m1. Similarly, over each interval d1, d2, d3, d4, d5, d6, etc., the tank management scenario 50 respectively defines maximum values M2, M3, M4, M5, M6, etc., and minimum values m2, m3, m4, m5, m6, etc.

The maximum value M1 is computed as a function of the average value P1 and as a function of one or more constraints relating to the tank 3. The constraints relating to the tank 3 can include safety constraints of the tank 3, such as the maximum safety pressure of the tank. All or some of the constraints relating to the tank 3 can be entered by the user by means of the acquisition means 42.

The maximum values M2 to M6 are computed in a similar manner, as a function of the average values P2 to P6 and of one or more constraints relating to the tank 3.

The minimum value m1 is computed as a function of the average value P1 and of the amount of gas to be extracted from the tank 3 during the interval d1 estimated in step 403 using the flow model 63.

The minimum values m2 to m6 are computed in a similar manner, as a function of the average values P2 to P6 and of the amounts of gas to be extracted from the tank 3 during the intervals d2 to d6.

In a simple alternative embodiment, the one or more tank management scenarios 50 thus post-processed simply can be displayed to the user, i.e., displayed together with the minimum values m1 to m6 and the corresponding maximum values M1 to M6. This allows the user to be offered additional assistance for decision-making, by also displaying to them a range of values, i.e., the interval [m1, M1], [m2, m2], etc., in which the pressure P can be allowed to vary within the interval d1, d2, etc.

As an alternative embodiment, either only the maximum values M1 to M6 or only the minimum values m1 to m6 can be computed and then displayed.

In a particularly preferred alternative embodiment, the one or more tank management scenarios 50 thus post-processed can also proceed, before step 310, to a step of further optimization intended to determine optimal values of the pressure P over sub-intervals of the intervals d1, d2, etc.

Figure 10:
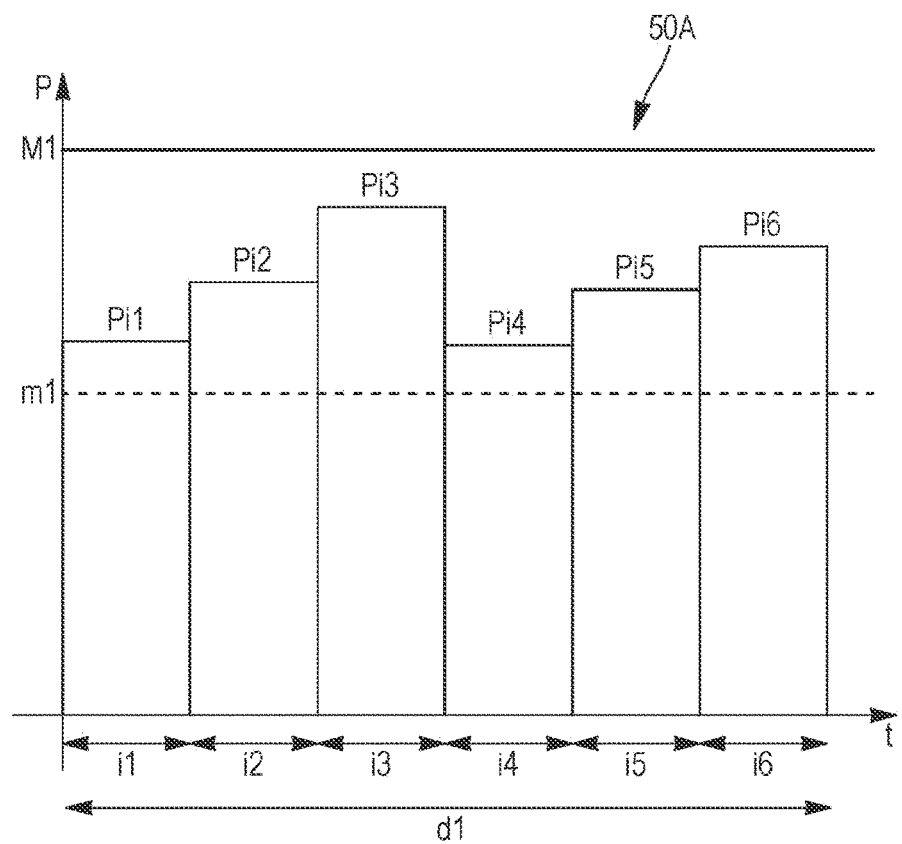
FIG. 10 is a graph showing, by way of an illustration, an example of a tank management scenario similar to that of FIG. 7, sub-divided into sub-intervals of time.

FIG. 10 is a graph showing, by way of an illustration, an example of a tank management scenario 50A thus optimized. As shown in this figure, the time interval d1 is sub-divided into several consecutive sub-intervals of time i1, i2, i3, i4, i5, i6, etc. The time intervals i2, i2, i3, i4, i5, i6, etc., particularly each can be equal to one hour. In addition to the average value P1 and the minimum m1 and maximum M1 values, the tank management scenario 50A defines average values Pi1, Pi2, Pi3, Pi4, Pi5, Pi6 on each of the sub-intervals of time i1, i2, i3, i4, i5, i6. Similarly, and although this is not shown in FIG. 10 for the sake of conciseness, the time intervals d2, d3, d4, d5, d6, etc., are also sub-divided into several consecutive sub-intervals of time, with an average value of the pressure P being defined on each of these sub-intervals.

The average values Pi1, Pi2, etc., are determined by an evolutionary algorithm using, as an objective function, a cost function that at least depends on a total amount of BOG generated in the tank 3 during the interval i1 and on compliance with the following criteria:
- the pressure P of the gas phase contained in the tank 3 remains below the maximum value M1;
- the pressure P of the gas phase contained in the tank 3 remains above the minimum value m1;
- the flow rate of BOG through the vapor phase treatment system 10 remains below a threshold value.

This determination is carried out using steps similar to steps 401 to 404 to 306 to 308, which therefore are not described in detail again. The one or more tank management scenarios 50A are then displayed to the user.

As mentioned above, the speed curve simply can be provided as input data, for example, by the user using the acquisition means 41, in step 304. However, in step 304, it is preferable for the speed curve to be determined by an evolutionary algorithm using an objective function that depends on a total amount of BOG generated in the tank 3 along the forecast path 80 and on a difference between a required time of arrival of the vessel 1 at the destination and an estimated time of arrival of the vessel 1. The required time of arrival of the vessel 1 at the destination can be entered by the user using the acquisition means 42.

Within the context of this evolutionary algorithm, in a manner per se known, speed management scenarios 550 are iteratively generated multiple times, with each new generation of speed management scenarios 550 being generated from a number of speed management scenarios 550 of the preceding generation that best minimize the objective function.

Figure 11:
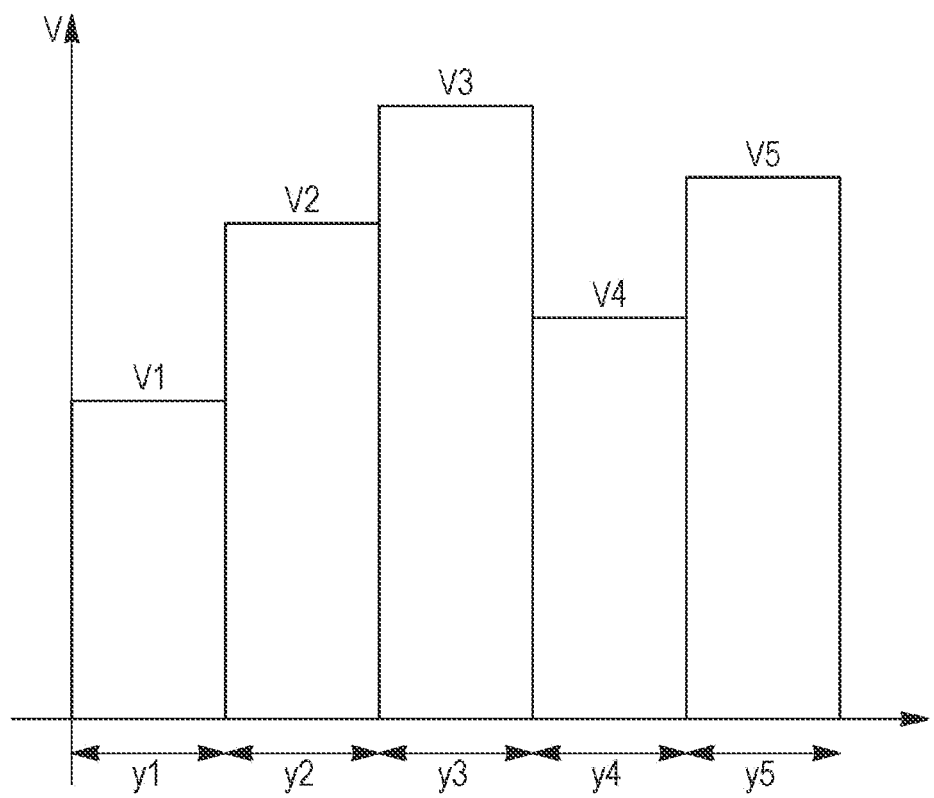
FIG. 11 is a graph showing, by way of an illustration, an example of a speed management scenario generated in the system for assisting management of FIG. 3 in some embodiments.

FIG. 11 is a graph showing, by way of an illustration, an example of a speed management scenario 550. As shown in this figure, with the forecast path 80 being divided into consecutive intervals of distance traveled y1, y2, y3, y4, y5, etc., a given speed management scenario 550 defines an evolution of the speed V of the vessel 1 by defining average values V1, V2, V3, V4, V5, etc., of the speed V over each of the consecutive intervals of distance traveled y1, y2, y3, y4, y5, etc. The intervals of distance travelled y1, y2, y3, y4, y5, etc., advantageously can be defined with reference to the points 81, 82, 83 of the forecast path 80.

Figure 12:
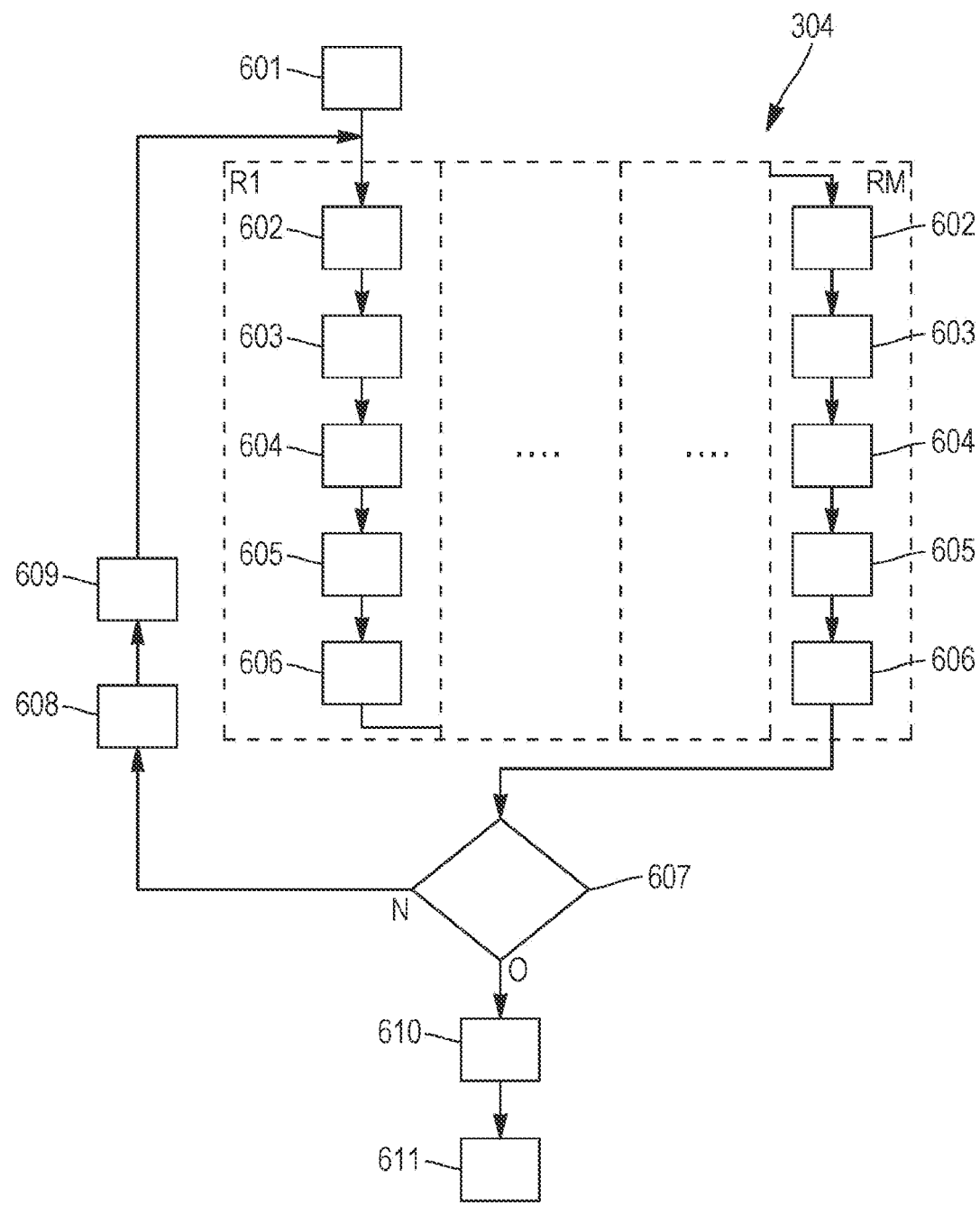
FIG. 12 is a block diagram showing, by way of an explanation, the models used by the system for assisting management of FIG. 3 in order to assess a given speed management scenario.

With reference to FIG. 12, the steps of implementing the evolutionary algorithm will now be described.

During a step 601, multiple speed management scenarios 550 are randomly generated, for example.

After step 601, with M being the number of speed management scenarios 550 generated in step 601, M assessments R1, R2, . . . , RM are carried out for each of the speed management scenarios 550. Although the diagram of FIG. 12 shows the assessments R1, R2, . . . , RM as being carried out sequentially, these optionally can be carried out at the same time. Each assessment R1, R2, . . . , RM comprises steps 602, 603, 604, 605, 606 that are described hereafter.

In step 602, an effective speed curve of the vessel 1 is estimated using a hydrodynamic model of the vessel 1.

In step 603, an effective trajectory of the vessel 1 is estimated on the basis of the actual speed curve estimated in step 602 and using a model of ocean currents.

In step 604, the at least one environmental parameter of the vessel 1 is determined along the actual trajectory of the vessel 1 on the basis of weather forecasts. Specifically, in a similar manner to step 303, using the communication interface 130, the central unit 110 acquires weather forecasts provided by a weather forecast provider, and determines the at least one environmental parameter on the basis of the weather forecasts and of the actual trajectory of the vessel 1 estimated in step 603.

In step 605, a curve of the amount of BOG generated in the tank 3 along the actual trajectory of the vessel 1 is estimated using the tank model 62.

After steps 601 to 605, in a step 606, the objective function is computed. The objective function is a real number that quantifies the acceptability of the speed management scenario 550. As mentioned above, the objective function depends on a total amount of BOG generated in the tank 3 along the forecast path 80 and on a difference between a required time of arrival of the vessel 1 and an estimated time of arrival of the vessel 1 at the destination.

After the assessments R1, R2, . . . , RM, the method proceeds to a step 607 involving verifying whether a stop criterion is verified. In one embodiment, the stop criterion is a computation time criterion. In other words, the stop criterion is considered to be verified if a computation time that is defined in advance is reached or exceeded. Alternatively, the stop criterion can be a criterion of a number of iterations.

In any case, if the stop criterion is not verified (reference "N" in step 607 in FIG. 12), the method proceeds to a step 608 involving selecting k' speed management scenarios 550 from among the M speed management scenarios 550 assessed during the assessments R1, R2, . . . , RM, where k'<M. The k' speed management scenarios 550 selected in step 608 are those that best minimize the objective function computed in step 606. In an alternative embodiment, k' is a number that is set in advance. In another alternative embodiment, k is not set in advance, and the selected k' speed management scenarios 550 are those for which the objective function computed in step 608 is below a threshold.

After step 608, the method proceeds to a step 609 involving generating M new tank management scenarios on the basis of the k' speed management scenarios 550 selected in step 608.

In a particular embodiment, the evolutionary algorithm is a genetic algorithm. Step 601 then involves initializing the group considered by the evolutionary algorithm by randomly generating M speed management scenarios 550, and step 609 involves generating M new speed management scenarios 550 by crossing and mutating the speed management scenarios 550 selected in step 608.

If, on the contrary, the stop criterion is verified (reference "O" in step 607 in FIG. 12), the method proceeds to a step 610 involving selecting the speed management scenario 550 that best minimizes the objective function computed in step 606. Finally, in step 611, this speed management scenario 550 is designated as the speed curve of the vessel 1 along said forecast path, after which the steps 305 to 310 and the assessments S1, S2, . . . , SN can be implemented as already described above.

The configuration of the vapor phase treatment system 10 shown in FIG. 2 is only one example. Other configurations are possible.

In some alternative embodiments, not shown, the vessel 1 can comprise more than one engine 40. In this case, the engine model 61 is capable of estimating the power required to be output from each engine 40 as a function of a speed setpoint of the vessel 1, of the at least one environmental parameter, and optionally of the heading of the vessel 1.

Figure 13:
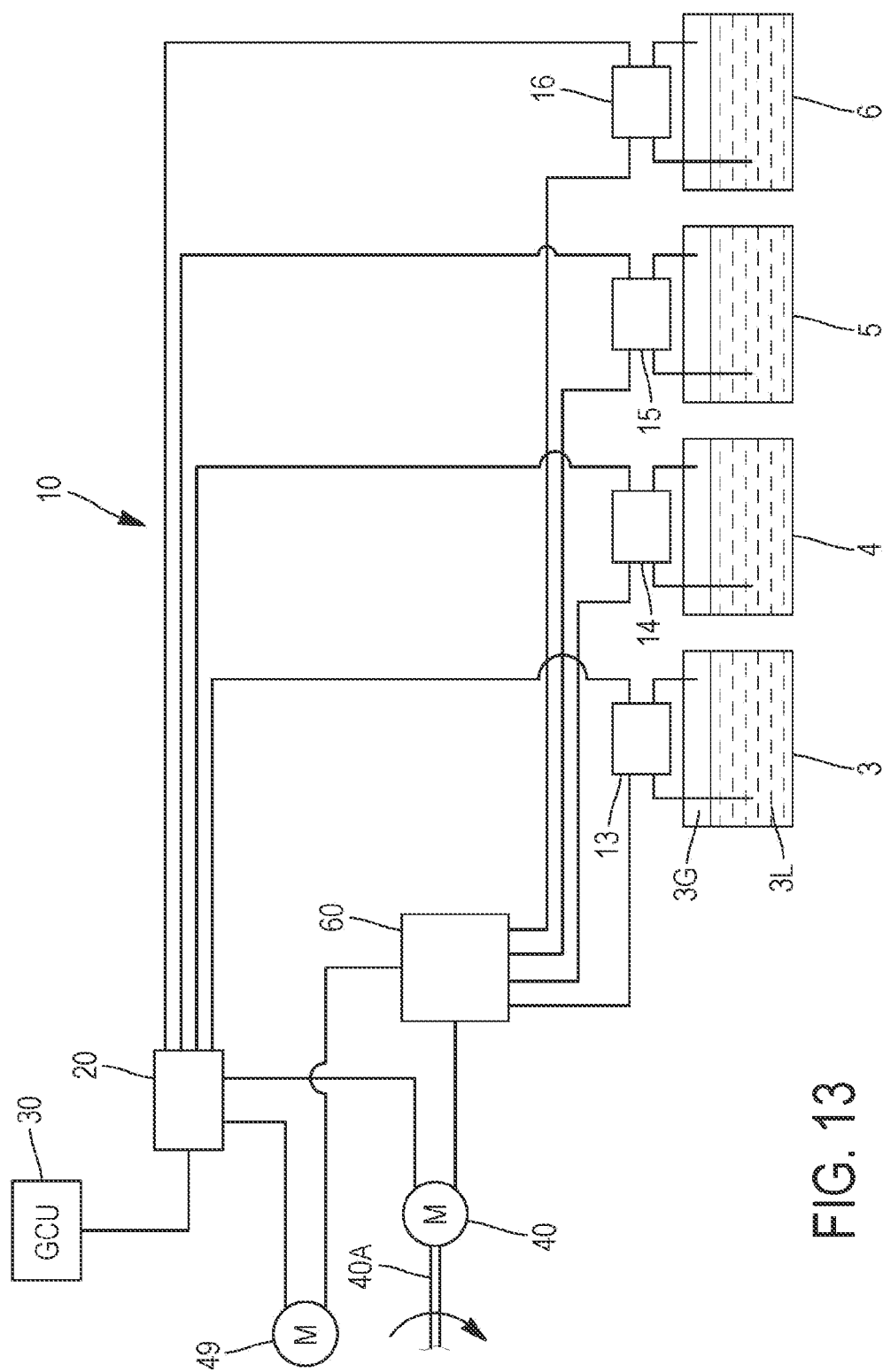
FIG. 13 is a block diagram similar to that of FIG. 2, showing an alternative embodiment of the vapor phase treatment system.

As mentioned above with respect to FIG. 2, the engine 40 can provide both the power required for the propulsion of the vessel 1 and the power required for electrically powering other equipment of the vessel 1 (commonly referred to as "Hotel Load"). However, as shown in FIG. 13, the vessel 1 can comprise an auxiliary engine 49 intended to supply this "Hotel Load" power. The auxiliary engine 49 is, like the engine 40, capable of consuming BOG originating from the BOG distribution unit 20 or the BOG originating from the heater 60. In this case, the engine model 61 is capable of estimating the power required to be output from the engine 40 and from the auxiliary engine 49 as a function of a speed setpoint of the vessel 1, of the at least one environmental parameter, and optionally of the heading of the vessel 1. It also should be specified that, as an alternative embodiment, several auxiliary engines 49 can be provided; in this case, in a similar manner, the engine model 61 is capable of estimating the power required to be output from the engine or engines 40 and auxiliary engines 49.

Figure 14:
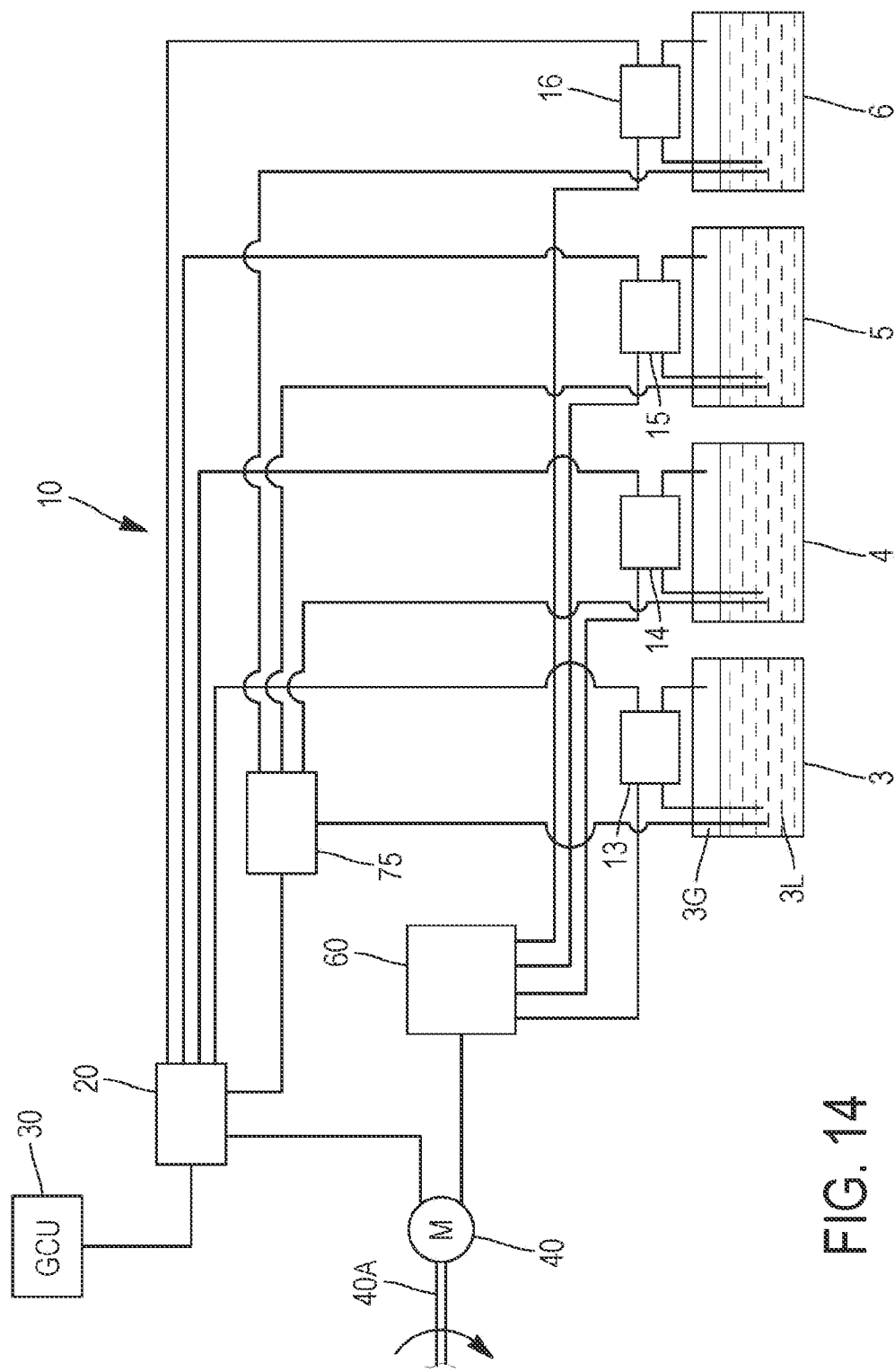
FIG. 14 is a block diagram similar to that of FIG. 2, showing another alternative embodiment of the vapor phase treatment system.

FIG. 14 shows another alternative embodiment of the vapor phase treatment system 10, which further comprises a reliquefaction plant 75.

In a manner per se known, the reliquefaction plant 75 is capable of receiving BOG originating from the BOG distribution unit 20, of reliquefying it, and of returning it to the tanks 3, 4, 5, 6. Such a reliquefaction plant 75 is known as such and therefore is not described in detail herein.

It should be specified that, although not shown in FIG. 14, the power (for example, electrical power) required to operate the reliquefaction plant 75 can be provided by the engine 40 or even by the auxiliary engine 49. It also should be specified that, in some alternative embodiments, not shown, the reliquefaction plant 75 can send reliquefied BOG only to one or some of the tanks 3, 4, 5, 6.

Of course, in this alternative embodiment, the flow model 63 takes into account the presence of the reliquefaction plant 75.

More specifically, the flow model 63 is capable of estimating an amount of gas to be extracted from the tank 3 by the vapor phase treatment sub-system 13, an amount of BOG to be burned in the GCU 30, and also an amount of BOG to be sent to the reliquefaction plant 75. More specifically, the flow model 63 estimates, on the basis of the power estimated by the model 61, an amount of BOG to be supplied to the engine 40, and compares this amount of BOG to be supplied to the engine 40 with the amount of BOG generated in the tank 3 estimated by the tank model 62. If the amount of BOG to be supplied to the engine 40 is greater than the amount of BOG generated in the tank 3, the flow model 63 determines that the difference between these two amounts is to be extracted from the tank 3 by the vapor phase treatment sub-system 13. Conversely, if the amount of BOG to be supplied to the engine 40 is less than the amount of BOG generated in the tank 3, the flow model 63 determines that the difference between these two amounts is to be preferably sent to the reliquefaction plant 75, and also to be burned in the GCU 30 only if the reliquefaction capacity of the reliquefaction plant 75 is insufficient.

It is also understood that, in this alternative embodiment, in step 403, on the basis of the curve of the power required to be output from the engine 40 estimated in step 401 and of the curve of the amount of BOG generated in the tank 3 estimated in step 402, a curve of the amount of gas to be extracted from the tank 3, a curve of the amount of BOG to be burned in the GCU 30, and a curve of the amount of BOG to be sent to the reliquefaction plant 75 are estimated using the flow model 63.

Figure 15:
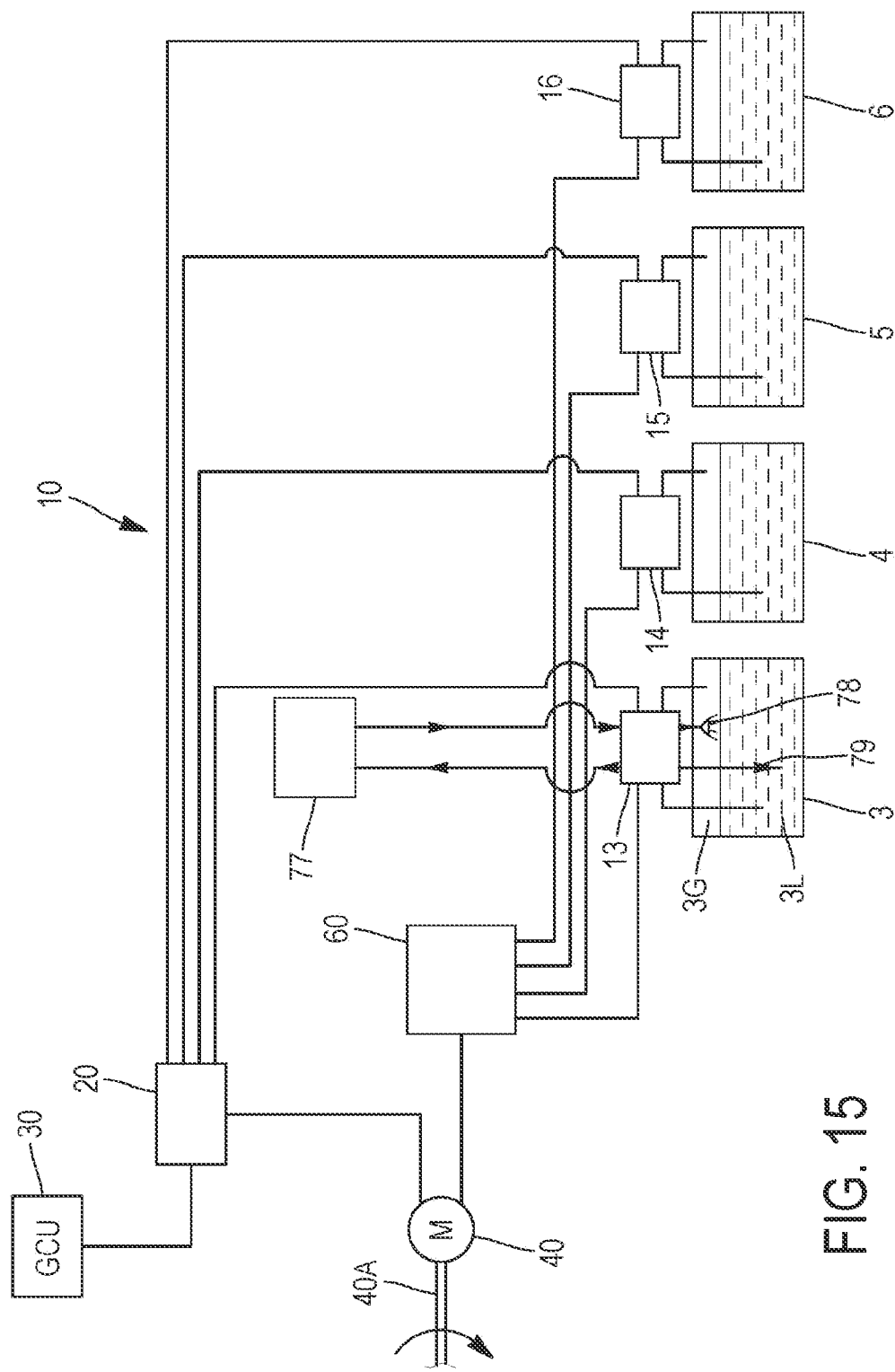
FIG. 15 is a block diagram similar to that of FIG. 2, showing yet another alternative embodiment of the vapor phase treatment system.

FIG. 15 shows yet another alternative embodiment of the vapor phase treatment system 10, which further comprises a sub-cooler 77.

In a manner per se known, the sub-cooler 77 is capable of receiving, from the vapor phase treatment sub-system 13, a portion of the liquid phase 3L contained in the tank 3 and of lowering its temperature (for example, by approximately 5 to 10 degrees Celsius, that is approximately −162° C. to approximately −167° C. to −172° C. in the case whereby the liquefied gas is LNG at atmospheric pressure). The sub-cooler 77 is also capable of returning the liquid phase thus sub-cooled to the tank 3, either directly in the liquid phase 3L by means of a mixing nozzle 79 known as such, or indirectly by spraying in the gas phase 3G in the form of droplets by means of a spraying ramp 78 known as such.

It should be specified that, not shown in FIG. 15, the power (for example, electrical power) required for operating the sub-cooler 77 can be provided by the engine 40 or even by the auxiliary engine 49. It also should be specified that in some alternative embodiments, not shown, the sub-cooler 77 can be capable of extracting the liquid phase from several or even all the tanks 3, 4, 5, 6 and of returning it to the respective tank in a sub-cooled condition.

Of course, in this alternative embodiment, the flow model 63 takes into account the presence of the sub-cooler 77.

More specifically, the flow model 63 is capable of estimating an amount of gas to be extracted from the tank 3 by the vapor phase treatment sub-system 13, an amount of BOG to be burned in the GCU 30, and also an amount of liquid phase to be sent to the sub-cooler 77. More specifically, the flow model 63 estimates, on the basis of the power estimated by the model 61, an amount of BOG to be supplied to the engine 40, and compares this amount of BOG to be supplied to the engine 40 with the amount of BOG generated in the tank 3 estimated by the tank model 62. If the amount of BOG to be supplied to the engine 40 is greater than the amount of BOG generated in the tank 3, the flow model 63 determines that the difference between these two amounts is to be extracted from the tank 3 by the vapor phase treatment sub-system 13. Conversely, if the amount of BOG to be supplied to the engine 40 is less than the amount of BOG generated in the tank 3, the flow model 63 determines that the difference between these two amounts is to be reduced over time by preferably operating the sub-cooler 77, with any excess BOG having to be burned in the GCU 30 only if the sub-cooling capacity of the sub-cooler 77 is insufficient.

It is also clearly understood that, in this alternative embodiment, in step 403, on the basis of the curve of the power required to be output from the engine 40 estimated in step 401 and of the curve of the amount of BOG generated in the tank 3 estimated in step 402, a curve of the amount of gas to be extracted from the tank 3, a curve of the amount of BOG to be burned in the GCU 30, and a curve of the amount of liquid phase to be extracted from the tank 3 and to be sent to the sub-cooler 77 are estimated using the flow model 63.

Finally, in some alternative embodiments, not shown, it should be specified that the sub-cooler 77 can be capable of extracting the liquid phase from one of the tanks 3, 4, 5, 6 and of returning it to one or more of the tanks 3, 4, 5, 6 in a sub-cooled condition. In this case, when the management assistance method 300 is implemented simultaneously for several or each of the tanks 3, 4, 5, 6 as mentioned above, the flow model 63 relating to a given tank also estimates an amount of a sub-cooled liquid phase to be received from the sub-cooler 77 originating from one or more other tanks.

Even though the invention has been described with reference to several particular embodiments, it is clear that it is by no means limited thereto and that it comprises all the technical equivalents of the means described, as well as their combinations, if they fall within the scope of the invention.

The use of the verbs "comprise" or "include" and their conjugated forms does not exclude the presence of elements or steps other than those described in a claim.

In the claims, any reference sign between brackets must not be interpreted as being a limitation of the claim.

The invention claimed is:

1. A computer-implemented method for assisting a management of a vessel for transporting liquefied gas, the vessel comprising a vapor phase treatment system and at least one tank configured to contain liquefied gas, the vapor phase treatment system being capable of sending boil-off gas exiting the tank to a propulsion engine of the vessel and to a gas combustion unit on board the vessel, the method comprising:
providing an initial state of the tank, said initial state of the tank comprising an initial pressure of the gas phase contained in the tank and an initial temperature of the liquid phase contained in the tank;
providing a forecast path of the vessel;
acquiring weather forecasts;
determining, on the basis of the acquired weather forecasts, at least one environmental parameter of the vessel along said forecast path;
determining a speed curve of the vessel along said forecast path;
generating a tank management scenario defining an evolution of the pressure of the gas phase contained in the tank during said forecast path, and, based on the generated tank management scenario:
a) estimating a curve of an indicative quantity on the basis of the tank management scenario, the indicative quantity being indicative of an operation of the propulsion engine along said forecast path, as a function of said speed curve of the vessel and of said at least one environmental parameter;
b) estimating a curve of an amount of the boil-off gas generated in the tank along said forecast path on the basis of the tank management scenario by using a tank model capable of estimating an amount of the boil-off gas generated in the tank;
c) estimating, on the basis of said curve of the indicative quantity and of said curve of the amount of the boil-off gas generated, a curve of an amount of the boil-off gas generated to be extracted from the tank and a curve of an amount of the boil-off gas generated to be burned in the gas combustion unit; and
displaying to a user the tank management scenario.

2. The method as claimed in claim 1, wherein the vapor phase treatment system is further capable of extracting a portion of the liquid phase contained in the tank and of evaporating the portion in order to send the portion to the propulsion engine.

3. The method as claimed in claim 1, wherein the indicative quantity is a power required to be output from the propulsion engine along said forecast path.

4. The method as claimed in claim 1, wherein multiple tank management scenarios are generated, with the steps a) to c) being carried out for each tank management scenario, the method further comprising:
d) assessing each tank management scenario by computing a cost function that depends at least on a total amount of the boil-off gas generated in the tank along said forecast path; and wherein the displaying of the tank management scenario to a user comprises displaying at least one of said tank management scenarios that best minimizes the cost function.

5. The method as claimed in claim 4, wherein, before displaying the at least one of said tank management scenarios to the user, said tank management scenarios are iteratively regenerated a number of times by a first evolutionary algorithm using the cost function as a first objective function.

6. The method as claimed in claim 1, wherein said forecast path comprises path steps each defined by two waypoints and a heading to be followed between said two waypoints, and wherein, in the step a), said curve of the indicative quantity is estimated as a function of said headings to be followed, of said speed curve of the vessel and of said at least one environmental parameter.

7. The method as claimed in claim 1, wherein said speed curve of the vessel is determined from said forecast path and from said at least one environmental parameter by a second evolutionary algorithm using a second objective function that depends on a total amount of the boil-off gas generated in the tank along said forecast path and on a difference between a required time of arrival at the destination and an estimated time of arrival at the destination.

8. The method as claimed in claim 4, wherein the method further comprises providing an offloading pressure and/or an offloading temperature required by an offloading terminal at the destination of the vessel, and wherein, in the step d), the cost function further depends on a difference between the pressure of the gas phase contained in the tank at the end of said forecast path and said offloading pressure and/or a difference between the temperature of the liquid phase contained in the tank at the end of said forecast path and said offloading temperature.

9. The method as claimed in claim 1, wherein, in the step a), said curve of the indicative quantity is estimated using a first statistical model, the first statistical model being capable of estimating said indicative quantity at least as a function of a vessel speed setpoint and of said at least one environmental parameter, and the first statistical model being trained by a supervised machine learning method.

10. The method as claimed in claim 1, wherein the step b) involving the estimating the curve of the amount of the boil-off gas generated in the tank along said forecast path comprises estimating a first amount of the boil-off gas generated in the tank as a function of a current pressure of the gas phase contained in the tank and of a current temperature of the liquid phase contained in the vessel and estimating a second amount of the boil-off gas generated in the tank as a function of a current pressure of the gas phase contained in the tank and of said at least one environmental parameter.

11. The method as claimed in claim 10, wherein the second amount of the boil-off gas generated in the tank is estimated using a second statistical model, the second statistical model being trained by a supervised machine learning method.

12. The method as claimed in claim 1, wherein the initial state comprises an initial composition of the liquefied gas contained in the tank, and wherein the step b) involving the estimating the curve of the amount of the boil-off gas generated in the tank along said forecast path further comprises estimating a composition of the boil-off gas generated in the tank.

13. The method as claimed in claim 1, wherein the environmental parameter comprises at least one from among a current direction, a current speed, a wind speed, a wind direction, an average wave height, a wave direction, and a wave period.

14. The method as claimed in claim 1, wherein the vapor phase treatment system further comprises a reliquefaction plant capable of reliquefying the boil-off gas exiting the tank and of returning the boil-off gas thus re-liquefied to the tank, and wherein the step c) comprises the estimating, on the basis of said curve of the indicative quantity and of said curve of the amount of the boil-off gas generated, the curve of the amount of the boil-off gas generated to be extracted from the tank, the curve of the amount of the boil-off gas generated to be burned in the gas combustion unit, and the curve of the amount of the boil-off gas generated to be sent to the reliquefaction plant.

15. The method as claimed in claim 1, wherein the steps of the method as claimed in claim 1 are repeated at fixed intervals and/or upon receipt of new weather forecasts.

16. The method as claimed in claim 1, wherein the vapor phase treatment system further comprises a sub-cooler capable of sub-cooling a portion of the liquid phase contained in the tank and of returning the portion thus sub-cooled to the tank, and wherein the step c) comprises the estimating, on the basis of said curve of the indicative quantity and of said curve of the amount of the boil-off gas generated, the curve of the amount of the boil-off gas generated to be extracted from the tank, the curve of the amount of the boil-off gas generated to be burned in the gas combustion unit, and the curve of the amount of liquid phase to be extracted from the tank and to be sent to the sub-cooler.

* * * * *